(12) United States Patent
Han et al.

(10) Patent No.: US 10,957,755 B2
(45) Date of Patent: Mar. 23, 2021

(54) DISPLAY PANEL HAVING A GATE DRIVING CIRCUIT ARRANGED DISTRIBUTIVELY IN A DISPLAY REGION OF THE DISPLAY PANEL AND ORGANIC LIGHT-EMITTING DIODE DISPLAY DEVICE USING THE SAME

(71) Applicant: LG Display Co., Ltd., Seoul (KR)

(72) Inventors: In-Hyo Han, Paju-si (KR); Ki-Min Son, Paju-si (KR); Kil-Hwan Oh, Paju-si (KR); Hae-Jin Park, Paju-si (KR); Kyung-Min Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 284 days.

(21) Appl. No.: 15/809,806

(22) Filed: Nov. 10, 2017

(65) Prior Publication Data

US 2018/0138256 A1 May 17, 2018

(30) Foreign Application Priority Data

Nov. 15, 2016 (KR) .................. 10-2016-0151960
Sep. 27, 2017 (KR) .................. 10-2017-0125355

(51) Int. Cl.
*G09G 5/10* (2006.01)
*H01L 27/32* (2006.01)
(Continued)

(52) U.S. Cl.
CPC .......... *H01L 27/3262* (2013.01); *G09G 3/20* (2013.01); *G09G 3/3225* (2013.01); *G09G 3/3233* (2013.01); *G09G 3/3266* (2013.01); *G09G 3/3275* (2013.01); *H01L 27/0248* (2013.01); *H01L 27/3276* (2013.01); *H01L 51/5237* (2013.01); *G09G 2300/023* (2013.01); (Continued)

(58) Field of Classification Search
None
See application file for complete search history.

(56) References Cited

U.S. PATENT DOCUMENTS 9,218,779 B2   12/2015 Kim
2008/0048948 A1  2/2008 Koh et al.
(Continued)

FOREIGN PATENT DOCUMENTS

CN    101131800 A    2/2008
CN    105280137 A    1/2016
(Continued)

OTHER PUBLICATIONS

Yoshida, H., et al., "Flexible Flat-Panel Display Designs with Gate Driver Circuits Integrated within the Pixel Area," SID Symposium Digest of Technical Papers, Jun. 2015, pp. 879~882, vol. 46, Issue 1.
(Continued)

*Primary Examiner* — Lunyi Lao
*Assistant Examiner* — Kirk W Hermann
(74) *Attorney, Agent, or Firm* — Fenwick & West LLP

(57) ABSTRACT

A display panel and an OLED display device using the same are disclosed. The display panel includes an active region including data lines, gate lines crossing the data lines, and pixels arranged in a matrix, and a shift register arranged distributively in the active region and configured to supply a gate pulse to the gate lines.

16 Claims, 31 Drawing Sheets

(51) Int. Cl.
  *G09G 3/3266* (2016.01)
  *G09G 3/3275* (2016.01)
  *G09G 3/3233* (2016.01)
  *H01L 51/52* (2006.01)
  *H01L 27/02* (2006.01)
  *G09G 3/3225* (2016.01)
  *G09G 3/20* (2006.01)
  *H01L 27/12* (2006.01)

(52) U.S. Cl.
  CPC .............. *G09G 2300/0408* (2013.01); *G09G 2300/0426* (2013.01); *G09G 2300/0452* (2013.01); *G09G 2310/0251* (2013.01); *G09G 2310/0281* (2013.01); *G09G 2310/0286* (2013.01); *G09G 2310/08* (2013.01); *G09G 2330/021* (2013.01); *G09G 2330/04* (2013.01); *G09G 2330/06* (2013.01); *G09G 2380/02* (2013.01); *H01L 27/1214* (2013.01); *H01L 27/3213* (2013.01)

(56) References Cited

U.S. PATENT DOCUMENTS

| | | | |
|---|---|---|---|
| 2011/0043541 A1* | 2/2011 | Cok | G09G 3/006 345/690 |
| 2011/0248968 A1* | 10/2011 | Suh | G02F 1/13454 345/204 |
| 2013/0321499 A1* | 12/2013 | Park | G09G 3/20 345/698 |
| 2013/0335367 A1 | 12/2013 | Kim | |
| 2014/0232664 A1* | 8/2014 | Henry | G06F 3/0412 345/173 |
| 2015/0092128 A1 | 4/2015 | Lee et al. | |
| 2015/0145852 A1* | 5/2015 | Ahn | G09G 3/3677 345/214 |
| 2015/0243208 A1* | 8/2015 | Kim | G09G 3/2022 345/204 |
| 2016/0210895 A1 | 7/2016 | Fan et al. | |
| 2016/0267831 A1* | 9/2016 | Seo | G09G 3/2085 |
| 2017/0255074 A1 | 9/2017 | Nishiyama et al. | |

FOREIGN PATENT DOCUMENTS

| | | |
|---|---|---|
| CN | 105321456 A | 2/2016 |
| CN | 105374319 A | 3/2016 |
| CN | 105742312 A | 7/2016 |
| CN | 207637473 U | 7/2018 |
| EP | 2 669 884 A2 | 12/2013 |
| EP | 2 902 994 A1 | 8/2015 |
| KR | 10-2013-0141134 A | 12/2013 |
| KR | 10-2015-0015608 | 2/2015 |
| KR | 10-2016-0056396 | 5/2016 |
| KR | 10-2016-0077315 | 7/2016 |
| KR | 10-2017-0078978 A | 7/2017 |
| WO | WO 2016/080542 | 8/2017 |

OTHER PUBLICATIONS

Office Action for Korean Patent Application No. KR 10-2016-0151960, dated Nov. 27, 2017, 9 Pages, (With Concise Explanation of Relevance).

Office Action for Korean Patent Application No. KR 10-2017-0125355, dated Nov. 27, 2017, 8 Pages, (With Concise Explanation of Relevance).

European Patent Office, Communication Pursuant to Article 94(3) EPC, EP Patent Application No. 17201590.1, dated May 31, 2019, six pages.

China National Intellectual Property Administration, Notification of the First Office Action, CN Patent Application No. 201711132894.X, dated Apr. 8, 2020, 17 pages.

European Partial Search Report, European Application No. 17201590.1, dated Feb. 21, 2018, 14 pages.

European Patent Office, Extended European Search Report and Opinion, EP Patent Application No. 17201590.1, dated May 7, 2018, 13 pages.

European Patent Office, Office Action, EP Patent Application No. 17201590.1, Jul. 1, 2020, ten pages.

Korean Intellectual Property Office, Notification of Reason for Refusal, KR Patent Application No. 10-2018-0060406, dated Aug. 24, 2020, 25 pages.

\* cited by examiner

DISPLAY PANEL HAVING A GATE DRIVING CIRCUIT ARRANGED DISTRIBUTIVELY IN A DISPLAY REGION OF THE DISPLAY PANEL AND ORGANIC LIGHT-EMITTING DIODE DISPLAY DEVICE USING THE SAME

CROSS REFERENCE TO RELATED APPLICATIONS

This application claims the benefit of Republic of Korea Patent Application No. 10-2016-0151960, filed on Nov. 15, 2016, and Republic of Korea Patent Application No. 10-2017-0125355, filed on Sep. 27, 2017, which are hereby incorporated by reference as if fully set forth herein.

BACKGROUND

Field of Technology

One or more embodiments of the present disclosure may relate to a display panel for disposing a gate driving circuit in a pixel array and an organic light-emitting diode display device using the same.

Discussion of the Related Art

A flat panel display device includes a Liquid Crystal Display (LCD) device, a Field Emission Display (FED) device, a Plasma Display Panel (PDP), an electroluminescent display device, and the like. The electroluminescent display device includes, for example, an organic light-emitting diode display device of an active matrix type (hereinafter, referred to as an "OLED display device").

A driving circuit of the flat panel display device includes a data driving circuit for supplying a data voltage to data lines and a gate driving circuit for sequentially supplying a gate pulse (or scan pulse) to gate lines (or scan lines). The gate driving circuit may be directly formed on the same substrate together with a Thin Film Transistor (TFT) of an active region constituting a pixel array. Hereinafter, the gate driving circuit directly formed on a substrate of a display panel will be referred to as a "Gate-In Panel (GIP) circuit". The GIP circuit includes a plurality of stages which are cascade-connected to each other and sequentially output a gate pulse (or scan pulse) to gate lines.

Each stage receives a start pulse or a carry signal received from a previous stage as the start pulse and outputs the gate pulse (or scan pulse) when a clock is input.

Each of the stages includes, as illustrated in FIGS. 1 and 2, a pull-up transistor Tu which charges an output terminal in response to a voltage of a Q node to raise an output voltage Vout(n), a pull-down transistor Td which discharges the output terminal in response to a voltage of a Q bar (QB) node to lower the output voltage Vout(n), and a switch circuit 10 which charges and discharges the Q node and the QB node. The output terminal of each stage is connected to a gate line of a display panel.

The pull-up transistor Tu charges the output terminal up to a gate on voltage VGH of a clock CLK when the clock CLK is input to a drain of the pull-up transistor Tu in a state in which the Q node is precharged by the gate on voltage VGH. If the clock CLK is input to the drain of the pull-up transistor Tu, the voltage of the Q node which is floated through capacitance between the drain and gate of the pull-up transistor Tu is raised up to a voltage corresponding to 2VGH by bootstrapping. In this case, the pull-up transistor Tu is turned on by the voltage of 2VGH of the Q node and the voltage of the output terminal is raised up to the gate on voltage VGH. The pull-down transistor Td supplies a gate off voltage VGL to the output terminal when the voltage of the QB node is charged up to the gate on voltage VGH, thereby discharging the output voltage Vout(n) up to the gate off voltage VGL.

The switch circuit 10 charges the Q node in response to a start pulse input through a VST terminal or a carry signal received from a previous stage and discharges the QB node in response to an RST terminal or a VNEXT terminal. A reset signal for simultaneously charging Q nodes of all stages S(N−1), S(N), and S(N+1) is applied to the RST terminal. A carry signal generated from a next stage is applied to the VNEXT terminal. The switch circuit 10 may charge and discharge the QB node in an opposite way to the Q node, using an inverter.

The GIP circuit is disposed in a bezel area outside an active region, making it difficult to design a narrow bezel. In a free-form display, since a bezel of a display panel may be circular or discrete, the free-form display has a difficulty in embedding the GIP circuit in the bezel area.

SUMMARY

Accordingly, one or more embodiments of the present disclosure are directed to a display panel capable of minimizing a bezel and disposing a GIP circuit in a display region of the display panel regardless of the shape of a bezel and an OLED display device using the same that substantially obviate one or more problems due to limitations and disadvantages of the related art.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display panel includes a display region including data lines, gate lines crossing the data lines, and pixels arranged in a matrix, and a gate driving circuit arranged distributively in the display region and configured to supply a gate pulse to the gate lines, wherein each of the pixels includes a plurality of subpixels having different colors, at least one of the subpixels is divided into a first circuit unit for driving a light-emitting element and a second circuit unit including a part of the gate driving circuit, and the first circuit unit and the second circuit unit are covered by an anode of the light-emitting element formed on the first circuit unit and the second circuit unit.

Transistors and data lines constituting the first circuit unit may be spatially separated from transistors and clock wirings constituting the second circuit unit.

The light-emitting element may include the anode formed on transistors of the first circuit unit and transistors of the second circuit unit, an organic compound layer deposited on the anode, and a cathode formed on the organic compound layer. Light emitted from the organic compound layer is reflected from the anode and is externally emitted through the cathode.

The size of a pattern of the anode may be larger than the size of the first pixel circuit unit.

The pattern of the anode formed on the first circuit unit and the second circuit unit may be continuously connected.

The size of each of a pattern of the anode and a pattern of the organic compound layer may be larger than the first pixel circuit unit.

Each of the pattern of the anode and the pattern of the organic compound layer of the light-emitting element formed on the first circuit unit and the second circuit unit may be continuously connected.

The second circuit unit may include a pull-up transistor for raising a voltage of the gate pulse, a Q node connected to a gate of the pull-up transistor, an output terminal through which the gate pulse is output, and a capacitor connected between the Q node and the output terminal. The capacitor may be arranged on a corresponding gate line.

The Q node may be arranged on the gate line.

The second circuit unit may include a pull-up transistor for raising a voltage of the gate pulse, a Q node connected to a gate of the pull-up transistor, a pull-down transistor for lowering the voltage of the gate pulse, a Qb node connected to a gate of the pull-down transistor, an output terminal formed between the pull-up transistor and the pull-down transistor, wherein the gate pulse is output through the output terminal, and a capacitor connected between the Q node and the output terminal. The Q node and Qb node may be arranged on a corresponding gate line.

The capacitor may be arranged on the gate line.

In another aspect of the present disclosure, a display panel includes a display region including data lines, gate lines crossing the data lines, and pixels arranged in a matrix, a gate driving circuit arranged distributively in the display region and configured to supply a gate pulse to the gate lines, and an electrostatic discharge protection element connected to the data lines and the gate lines, wherein each of the pixels includes a plurality of subpixels having different colors, the pixels include a first subpixel divided into a first circuit unit for driving a first light-emitting element and a second circuit unit including a part of the shift register, a second subpixel divided into a third circuit unit for driving a second light-emitting element and a fourth circuit unit including the electrostatic discharge protection element, the first circuit unit and the second circuit unit are covered by an anode of the first light-emitting element formed on the first circuit unit and the second circuit unit, and the third circuit unit and the fourth circuit unit are covered by an anode of the second light-emitting element formed on the third circuit unit and the fourth circuit unit.

In another aspect of the present disclosure, an Organic Light-Emitting Diode (OLED) display device, comprising: a display region including data lines, gate lines crossing the data lines, and pixels arranged in a matrix; a data driving circuit configured to supplying a data voltage to the data lines; and a gate driving circuit configured to sequentially supply a gate pulse to the gate lines, wherein the gate driving circuit is arranged distributively in the display region and configured to supply a gate pulse to the gate lines, each of the pixels includes a plurality of subpixels having different colors, at least one of the subpixels is divided into a first circuit unit for driving a light-emitting element and a second circuit unit including a part of the gate driving circuit, and the first circuit unit and the second circuit unit are covered by an anode of the light-emitting element formed on the first circuit unit and the second circuit unit.

In another aspect of the present disclosure, a display panel includes a display region including data lines, gate lines crossing the data lines, and unit pixel regions arranged in a matrix at a crossing portion of the data lines and the gate lines, and a gate driving circuit arranged distributively in the display region, wherein the gate driving circuit includes a plurality of stages, and a stage is arranged distributively in a plurality of unit pixel regions driven by each gate line to supply a scan pulse to a corresponding gate line.

Two or more stages are distributively arranged in the plurality of unit pixel regions driven by each gate line.

Each of the unit pixel regions may include a pixel circuit unit including at least three subpixel units, a GIP circuit unit in which one element constituting the stage is arranged, and a GIP internal connection wiring unit in which connection wirings for connecting elements of the stage are connected.

The GIP circuit unit may be disposed at the upper side of the internal connection wiring unit and on the right side of the pixel circuit unit.

The GIP circuit unit may be disposed at the upper side of the internal connection wiring unit and on the left side of the pixel circuit unit.

The GIP circuit unit may be disposed between the GIP internal connection wiring unit and the pixel circuit unit.

The GIP circuit unit may be disposed at the lower side of the GIP internal connection wiring unit, which is an opposite side of the pixel circuit unit.

Elements constituting the stage may be distributively disposed in the plurality of unit pixel regions driven by each gate line and the elements constituting the stage are divided according to function.

The elements constituting the stage may be arranged in order of a scan pulse output unit, an inverter unit, a carry pulse output unit, and a switching circuit unit.

An element having a relatively large size among the elements constituting the stage may be divided to be spread in the unit pixel regions along a corresponding gate line.

Touch sensors may be further disposed in the display region.

In another aspect of the present disclosure, an Organic Light-Emitting Diode (OLED) display device includes a display region including a plurality of data lines, a plurality of gate lines crossing the data lines, and unit pixel regions arranged in a matrix at a crossing portion of the data lines and the gate lines, a plurality of source drive Integrated Circuits (ICs) configured to supplying a data voltage to the data lines; and a plurality of gate driving circuits arranged distributively in the display region and configured to supply a gate pulse to each gate line, wherein the display region is divided into a plurality of blocks, which are regions driven by the respective drive ICs, and each group is driven by each of the source drive ICs, and at least one gate driving circuit is independently arranged in each block.

In another aspect of the present disclosure, an Organic Light-Emitting Diode (OLED) display device, comprising: a display region including a plurality of data lines, a plurality of gate lines crossing the data lines, and a plurality of unit pixel regions arranged in a matrix at a crossing portion of the data lines and the gate lines; a plurality of source drive Integrated Circuits (ICs) configured to supplying a data voltage to the data lines; and a plurality of gate driving circuits arranged distributively in the display region and configured to supply a gate pulse to each gate line, wherein the display region is divided into a plurality of blocks, which are regions driven by the respective drive ICs, and each group is driven by each of the source drive ICs, and one gate driving circuit is arranged in two adjacent blocks driven by two adjacent source drive ICs.

In another aspect of the present disclosure, an Organic Light-Emitting Diode (OLED) display device, comprising: a display region including a plurality of data lines, a plurality of gate lines crossing the data lines, and a plurality of unit pixel regions arranged in a matrix at a crossing portion of the data lines and the gate lines; a plurality of source drive Integrated Circuits (ICs) configured to supplying a data voltage to the data lines; and a plurality of gate driving circuits arranged distributively in the display region and configured to supply a gate pulse to each gate line, wherein the display region is divided into a plurality of blocks, which are regions driven by the respective drive ICs, and each group is driven by each of the source drive ICs, and one gate driving circuit is arranged in three adjacent blocks driven by three adjacent source drive ICs.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
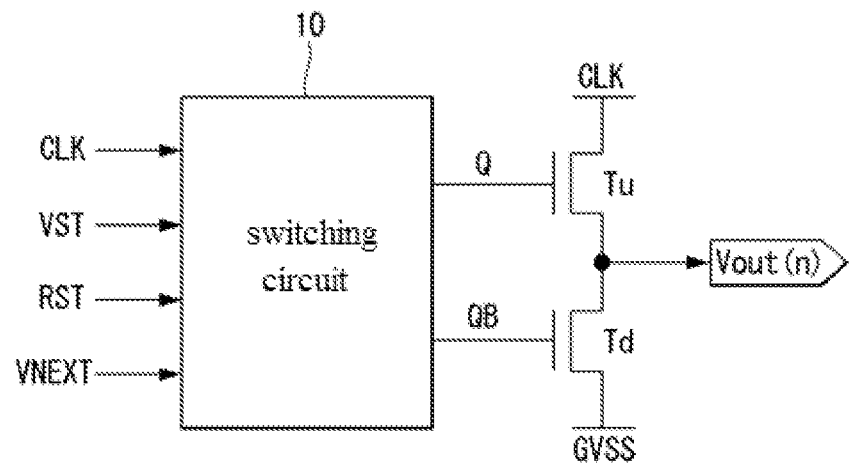
FIG. 1 is a diagram schematically illustrating one stage of a gate driving circuit.
Figure 2:
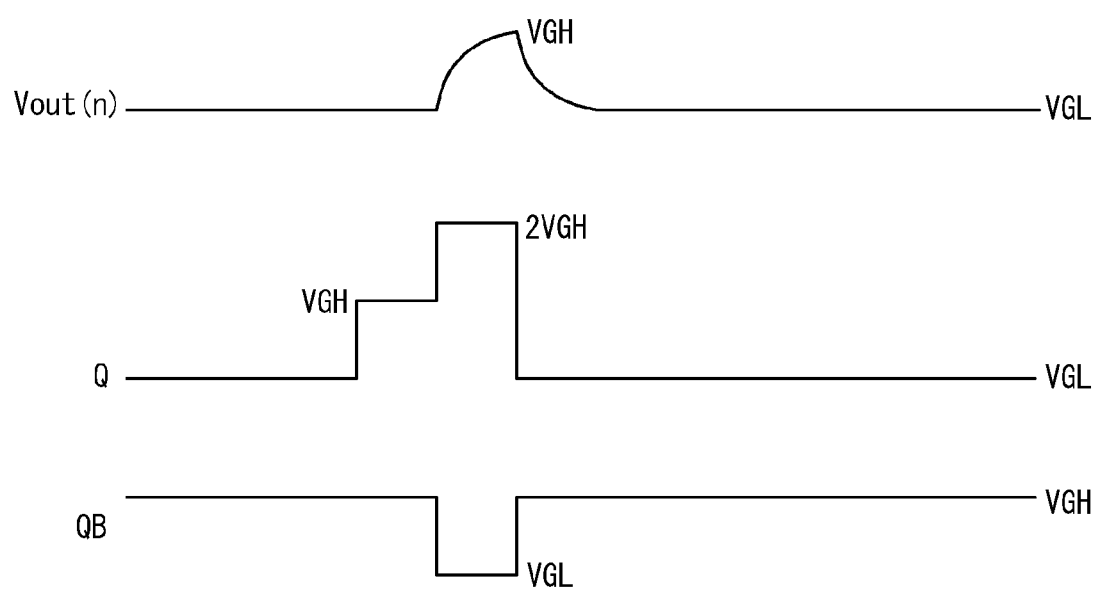
FIG. 2 is a waveform chart illustrating an operation of the stage illustrated in FIG. 1.

Advantages and features of the embodiments of the present disclosure, and implementation methods thereof will be clarified through the following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure can be defined by scope of the claims.

A shape, a size, a ratio, an angle, and a number disclosed in the drawings for describing embodiments of the present disclosure are merely an example, and thus, the inventive technical scope is not limited to the illustrated details. Like reference numerals refer to like elements throughout. In the following description, when the detailed description of the relevant known function or configuration is determined to unnecessarily obscure the technical concepts, the detailed description will be omitted.

In a case where 'comprise', 'have', and 'include' described in the present specification are used, another part may be added unless 'only' is used. The terms of a singular form may include plural forms unless stated otherwise.

In construing an element, an element is construed as including an error range although there is no explicit description.

In describing a positional relationship, for example, when two portions are described as "on", "over", "below", or "on the side", one or more other portions may be positioned between the two portions unless "immediately" or "directly" is used.

While the terms "first", "second" etc. may be used to distinguish one element from another, the function or structure of an element is not limited by an ordinal number preceding the element or name of the element.

Features of various embodiments of the present disclosure may be partially or overall coupled to or combined with each other, and may be variously interoperated with each other and driven. The embodiments of the present disclosure may be carried out independently from each other or may be carried out together in a dependent relationship.

A GIP circuit and a pixel circuit of the present disclosure may be implemented as a TFT of an n-type or p-type Metal Oxide Semiconductor TFT (MOSFET) structure. In the following embodiments, n-type TFTs are exemplified but it should be noted that the present disclosure is not limited thereto. A TFT is a three-electrode device including a gate, a source, and a drain. The source is an electrode for supplying carriers to the TFT. In the TFT, carriers start to flow from the source. The drain is an electrode from which carriers externally flows in the TFT. That is, carriers in the MOSFET flow from the source to the drain. In the n-type MOSFET (NMOS), since carriers are electrons, a source voltage is lower than a drain voltage so that electrons flow from the source to the drain. In the n-type MOSFET, since electrons flow from the source to the drain, current flows from the drain to the source. In the p-type MOSFET (PMOS), since carriers are holes, the source voltage is higher than the drain voltage so that holes flow from the source to the drain. In the p-type TFT, since holes flow from the source to the drain, current flows from the source to the drain. It should be noted that the source and drain of the MOSFET are not fixed. For example, the source and drain of the MOSFET may vary according to a supplied voltage. In the following embodiments, transistors constituting the GIP circuit and the pixel circuit are exemplarily implemented as n-type TFTs but the present disclosure is not limited thereto. Accordingly, the present disclosure should not be limited by the source and drain of a TFT in the following description.

A gate pulse output from the GIP circuit swings between a gate on voltage (or Gate High Voltage (VGH)) and a gate off voltage (or Gate Low Voltage (VGL)). The gate on voltage VGH is set to a voltage higher than a threshold voltage of a TFT and the gate off voltage VGL is set to a voltage lower than the threshold voltage of the TFT. In the n-type TFT, the gate on voltage may be the gate high voltage VGH and the gate off voltage may be the gate low voltage VGL. In the p-type TFT, the gate on voltage may be the gate low voltage VGL and the gate off voltage may be the gate high voltage VGH.

Figure 3:
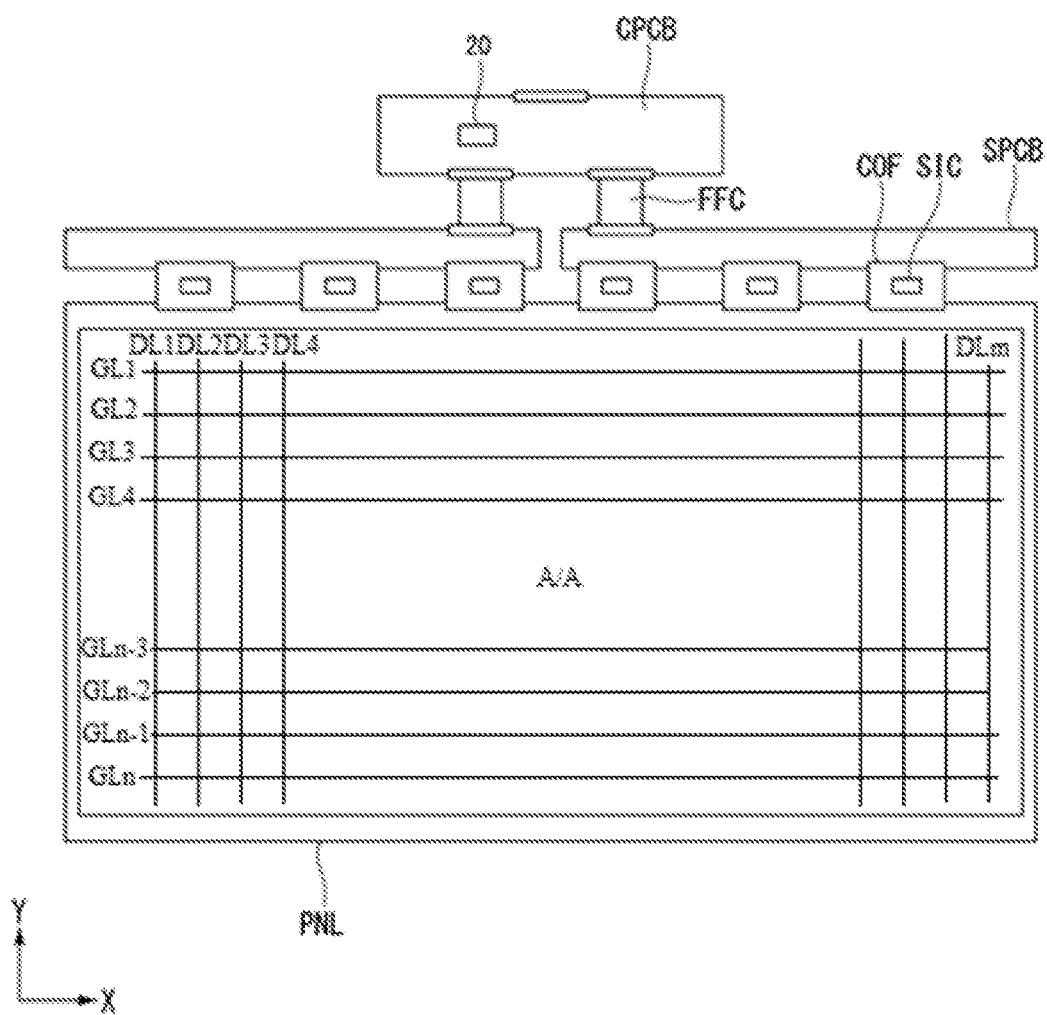
FIG. 3 is a block diagram schematically illustrating configuration of an OLED display device according to at least one embodiment of the present disclosure.

FIG. 3 is a block diagram schematically illustrating configuration of an OLED display device according to the present disclosure.

Referring to FIG. 3, the OLED display device of the present disclosure includes a display panel PNL and a display panel driving circuit for writing data of an input image in the display panel PNL.

A display region AA of the display panel PNL includes a plurality of data lines DL1 to DLm and a plurality of gate lines GL1 to GLn which cross each other, and a plurality of subpixels arranged in a matrix by the data lines DL1 to DLm and the gate lines GL1 to GLn. Touch sensors may be further disposed in the display region AA of the display panel PNL.

The subpixels include red (R), green (G), and blue (B) subpixels to implement colors and may further include a white (W) subpixel in addition to the R, G, and B subpixels. At least a part of the subpixels includes a part of a GIP circuit.

A GIP circuit is distributively disposed in the display region AA. At least one of the subpixels is divided into a first circuit unit for driving a first light-emitting element and a second circuit unit including a part of the GIP circuit. The first circuit unit and the second circuit unit are covered by an electrode pattern of the light-emitting element, for example, an anode, formed on the first circuit unit and the second circuit unit. A light-emitting region of a subpixel including the first circuit unit and the second circuit unit may be larger than the first circuit unit. Hereinafter, the first circuit unit will be referred to as a "pixel circuit unit" and the second circuit unit will be referred to as a "GIP circuit unit". Among the subpixels, each of the remaining subpixels after the GIP circuit is disposed in subpixels may be divided into a third circuit unit for driving a second light-emitting element and a fourth circuit unit including an Electrostatic Discharge (ESD) protection element. A light-emitting region including the third circuit unit and the fourth circuit unit may be larger than the third circuit unit.

The display panel driving circuit includes a data driving circuit for supplying a data voltage of an input image to the data lines DL of the display panel PNL, a gate driving circuit for supplying a scan pulse synchronized with the data voltage to the gate lines GL of the display panel PNL, and a timing controller 20 for controlling operation timings of the data driving circuit and the gate driving circuit.

The data driving circuit may include one or more source drive Integrated Circuits (ICs) SIC. The source drive IC SIC generates a data voltage by converting digital video data of an input image into an analog gamma compensation voltage under control of the timing controller 20 and outputs the data voltage to the data lines DL. The source drive IC SIC may be embedded in a bendable flexible Printed Circuit Board (PCB), for example, a Chip-On-Film (COF), or may be directly bonded to a substrate of the display panel PNL through a Chip-On-Glass (COG) process. COFs are bonded to the display panel PNL and a source PCB SPCB through an Anisotropic Conductive Film (ACF). Input pins of the COFs are electrically connected to output terminals of the source PCB SPCB. Output pins of the COFs are electrically connected to data pads formed on the display panel PNL through the ACF.

The gate driving circuit includes a plurality of stages which are cascade-connected to each other for outputting a scan pulse in response to a gate timing control signal. The gate driving circuit sequentially supplies a gate pulse synchronized with a data voltage to the gate lines GL under control of the timing controller 20, thereby selecting pixels of one line into which pixel data of an input image is written.

The timing controller 20 is embedded in a control PCB CPCB, and the control PCB CPCB and the source PCB SPCB are connected by a Flexible Flat Cable (FFC).

The stage receives gate timing control signals such as a start pulse and a clock and outputs a gate pulse to the gate lines GL when the clock is input.

Figure 4:
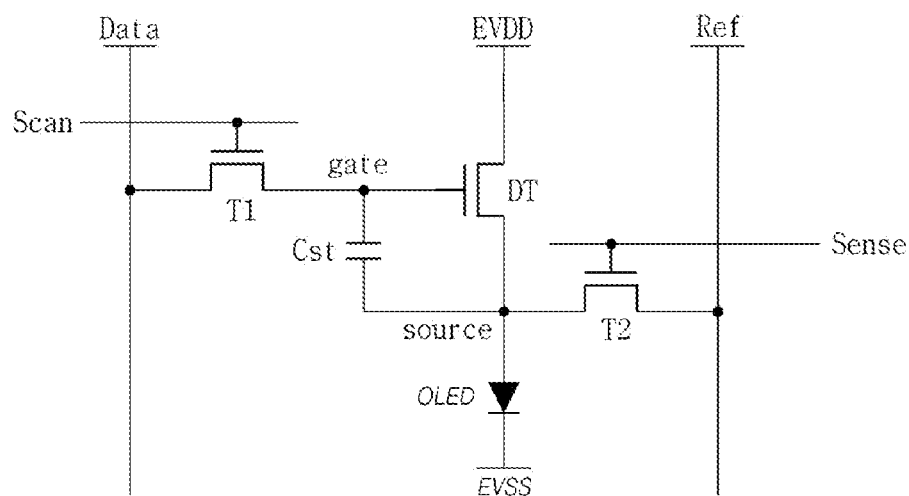
FIG. 4 is a diagram illustrating a circuit configuration of one subpixel in the OLED display device of FIG. 3.

A circuit configuration of one subpixel in an OLED display device according to the present disclosure is as illustrated in FIG. 4.

FIG. 4 illustrates a circuit configuration of one subpixel in the OLED display device of FIG. 3 according to the present disclosure.

Each subpixel of the OLED display device according to the present disclosure includes, as illustrated in FIG. 4, an Organic Light-Emitting Diode (OLED) and a pixel circuit for driving the OLED.

The pixel circuit includes first and second switching TFTs T1 and T2, a storage capacitor Cst, and a driving TFT DT.

The first switching TFT T1 charges a data voltage Data in the storage capacitor Cst in response to a scan pulse Scan. The driving TFT DT adjusts the amount of light emission of the OLED by controlling current supplied to the OLED according to the data voltage charged in the storage capacitor Cst. The second switching TFT T2 senses a threshold voltage and mobility of the driving TFT DT in response to a sensing signal Sense.

The OLED may include a first electrode (e.g., an anode or a cathode), an organic light-emitting layer, and a second electrode (e.g., a cathode or an anode).

The storage capacitor Cst may be electrically connected between a gate and a source of the driving TFT DT to maintain a data voltage corresponding to an image signal for one frame time.

In FIG. 4, although a subpixel configuration of three TFTs T1, T2, and DT and one storage capacitor Cst (3T1C) is illustrated, the present disclosure is not limited thereto and each subpixel of the OLED display device according to the present disclosure may have subpixel configurations such as 4 TFTs and 1 capacitor (4T1C), 4 TFTs and 2 capacitors (4T2C), 5 TFTs and 1 capacitor (5T1C), 5 TFTs and 2 capacitors (5T2C), etc.

Figure 5:
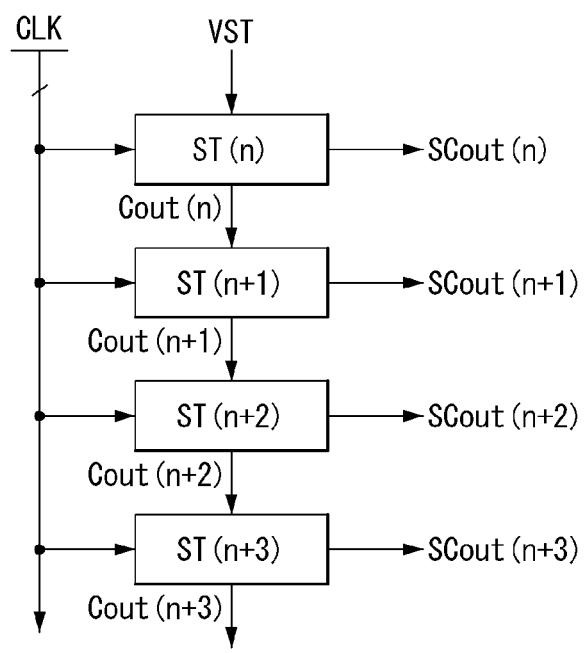
FIG. 5 is a diagram schematically illustrating stages cascade-connected to each other in a gate driving circuit.

FIG. 5 is a diagram schematically illustrating stages cascade-connected to each other in the gate driving circuit.

Figure 6:
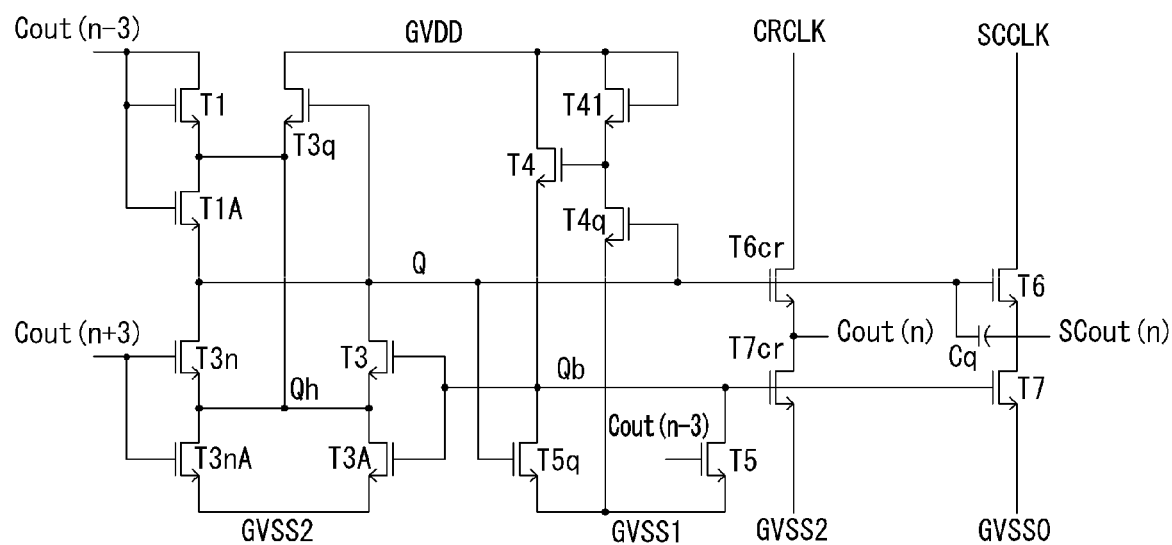
FIG. 6 is a circuit diagram illustrating an example of a stage.

Referring to FIG. 5, the gate driving circuit includes a plurality of stages S(n) to S(n+3) which are cascade-connected to each other. FIG. 6 is a circuit diagram illustrating an example of a stage. The stage of FIG. 6 illustrates an n-th stage.

The stages ST(n) to ST(n+3) sequentially supply respective gate pulses SCout(n) to SCout(n+3) to gate lines GL and transfer the respective carry signals Cout(n) to Cout(n+3) to other stages. The gate pulses SCout(n) to SCout(n+3) and the carry signals Cout(n) to Cout(n+3) may be simultaneously output through one output terminal by the stages ST(n) to ST(n+3) or may be separately output through two output terminals by the stages ST(n) to ST(n+3) as illustrated in FIGS. 5 and 6. The stages to which the carry signals Cout(n) to Cout(n+3) are transmitted are not limited to specific stages. For example, as illustrated in FIG. 6, an n-th (where n is a positive integer) stage may receive, without being limited to, carry signals Cout(n−3) and Cout(n+3) output from an (n−3)-th stage and (n+3)-th stage, respectively.

Referring to FIG. 6, the stage includes a first output circuit unit 24 for outputting a gate (scan) pulse SCout (n) through a first output terminal according to a voltage of a Q node and a voltage of a Qb node, a second output circuit unit 23 for outputting a carry signal Ccout(n) through a second output terminal according to the voltage of the Q node and the voltage of the Qb node, a switch circuit unit 21 for charging and discharging the Q node and a Qb node, and an inverter unit 22 for inverting the voltage of the Q node and supplying the inverted voltage to the Qb node.

The first output circuit unit 24 includes a first pull-up transistor T6 which is turned on to charge a voltage of the first output terminal when a clock SCCLK is input in a state in which the Q node is precharged and a first pull-down transistor T7 for discharging the voltage of the first output terminal when the voltage of the Qb node is charged. A capacitor Cq is connected between the Q node and the first output terminal. The first pull-up transistor T6 includes a gate connected to the Q node, a drain to which the clock SCCLK is applied, and a source connected to the first output terminal. The first pull-down transistor T7 includes a gate connected to the Qb node, a drain connected to the first output terminal, and a source connected to a GVSS0 node. A gate low voltage VGL0 is applied to the GVSS0 node.

The second output circuit unit 23 includes a second pull-up transistor T6cr which is turned on to charge a voltage of the second output terminal when a clock CRCLK is input in a state in which the Q node is precharged and a second pull-down transistor T7cr for discharging the voltage of the first output terminal when the voltage of the Qb node is charged. The second pull-up transistor T6cr includes a gate connected to the Q node, a drain to which the clock CRCLK is applied, and a source connected to the second output terminal. The second pull-down transistor T7cr includes a gate connected to the Qb node, a drain connected to the second output terminal, and a source connected to a GVSS2 node. A gate low voltage VGL2 is applied to the GVSS2 node. VGL2 may be set to a voltage lower than VGL0.

The switch circuit unit 21 charges and discharges the Q node, Qb node, and Qh node, using a plurality of TFTs T1, T1A, T3, T3q, T3A, T3n, T3nA.

The inverter unit 22 inverts the voltage of the Q node and supplies the inverted voltage to the Qb node, using a plurality of TFTs T4, T41, T4q, T5, and T5q.

An operation of the stage of FIG. 6 will be described with reference to FIGS. 8 to 19.

The TFTs T1 and T1A charge the voltage of the Q node and the voltage of the Qh node to a gate high voltage VGH in response to a carry signal Cout(n−3) input from the (n−3)-th stage. The TFT T1 includes a gate and a drain to which the carry signal Cout(n−3) is applied and a source connected to the Qh node. The TFT T1A includes a gate to which the carry signal Cout(n−3) is input, a drain connected to the Qh node, and a source connected to the Q node.

The TFT T3q is turned on to connect the Qh node to a GVDD node in response to the voltage of the Q node which is precharged, thereby charging the Qh node to a gate high voltage VGH applied through the GVDD node. The TFT T3q includes a gate connected to the Q node, a drain connected to the GVDD node, and a source connected to the Qh node.

The TFTs T3n and T3nA connects the Q node and the Qh node to the GVSS2 node in response to a carry signal Cout(n+3) input from the next stage. The TFT T3n includes a gate to which the carry signal Cout(n+3) is applied, a drain connected to the Q node, and a source connected to the Qh node. The TFT T3na includes a gate to which the carry signal Cout(n+3) is applied, a drain connected to the Qh node, and a source connected to the GVSS2 node.

The TFTs T3 and T3A are turned on in response to the Qb node to connect the Q node and the Qh node to the GVSS2 node, thereby discharging the Q node. The TFT T3 includes a gate connected to the Qb node, a drain connected to the Q node, and a source connected to the Qh node. The TFT T3A includes a gate connected to the Qb node, a drain connected to the Qh node, and a source connected to the GVSS2 node.

The TFTs T4, T41, and T4q charge the Qb node to the gate high voltage VGH when the voltage of the Q node is not charged. The TFT T41 includes a gate and a drain connected to the GVDD node to which the gate high voltage VGH is applied and a source connected to a gate of the TFT T4 and to a drain of the TFT T4q. The TFT T4 includes the gate connected to the source of the TFT T41 and to the drain of the TFT T4q, a drain connected to the GVDD node, and a source connected to the Qb node. The TFT T4q includes a gate connected to the Q node, a drain connected to the source of the TFT T41 and to the gate of the TFT T4, and a source connected to a GVSS1 node. VGL1 is applied to the GVSS1 node. VGL1 may be set to a voltage lower than VGL0 and higher than VGL2.

The TFT T5q is turned on to connect the Qb node to the GVSS1 node according to the voltage of the Q node which is precharged, thereby discharging the Qb node. The TFT T5q includes a gate connected to the Q node, a drain connected to the Qb node, and a source connected to the GVSS1 node.

The TFTs T4, T41, T4q and T5q constitute an inverter.

The TFT T5 is turned on to discharge the Qb node in response to the carry signal Cout(n−3) input from the (n−3)-th stage. The TFT T5 includes a gate to which the carry signal Cout(n−3) is applied, a drain connected to the Qb node, and a source connected to the GVSS1 node.

Figure 7:
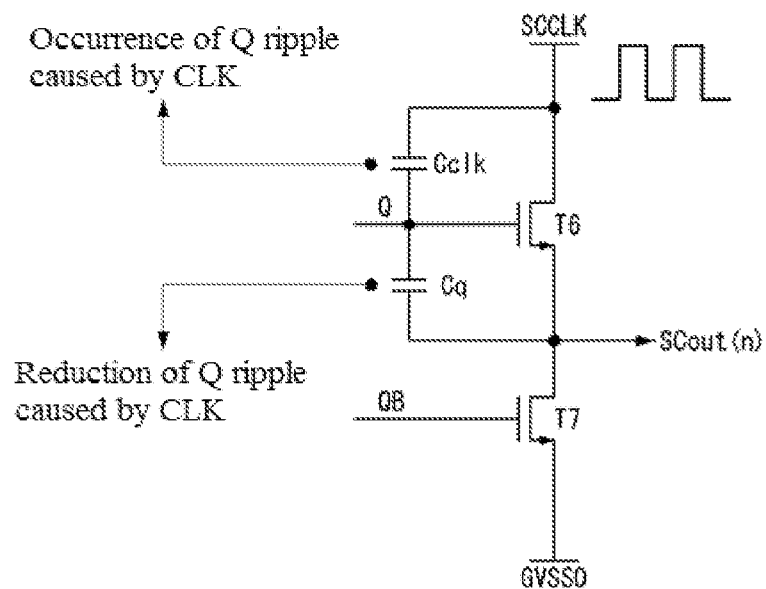
FIG. 7 is a diagram illustrating an effect of reducing ripples of a capacitor formed between a Q node and an output terminal.

FIG. 7 is a diagram illustrating an effect of reducing ripples of a capacitor formed between a Q node and an output terminal.

Referring to FIG. 7, the gate of the pull-up transistor T6 is connected to the Q node of the stage. The capacitor Cq is connected between the Q node and the first output terminal, i.e., between the gate and source of the pull-up transistor T6. A capacitor Cclk is present between the drain and gate of the pull-up TFT T6. The capacitor Cclk may cause parasitic capacitance between the gate and drain of the pull-up transistor T6. A ripple Qripple of the Q node is indicated by an equation below. In the following equation, "$C_{extra}$" is other parasitic capacitances except for the parasitic capacitance of the capacitor Cclk. Whenever a clock SCCLK is generated, a ripple may occur in the voltage of the Q node. Such a ripple may be reduced by the capacitor Cq.

$$Q_{ripple} = \frac{C_{clk}}{C_{clk} + C_q + C_{extra}}$$

Figure 10:
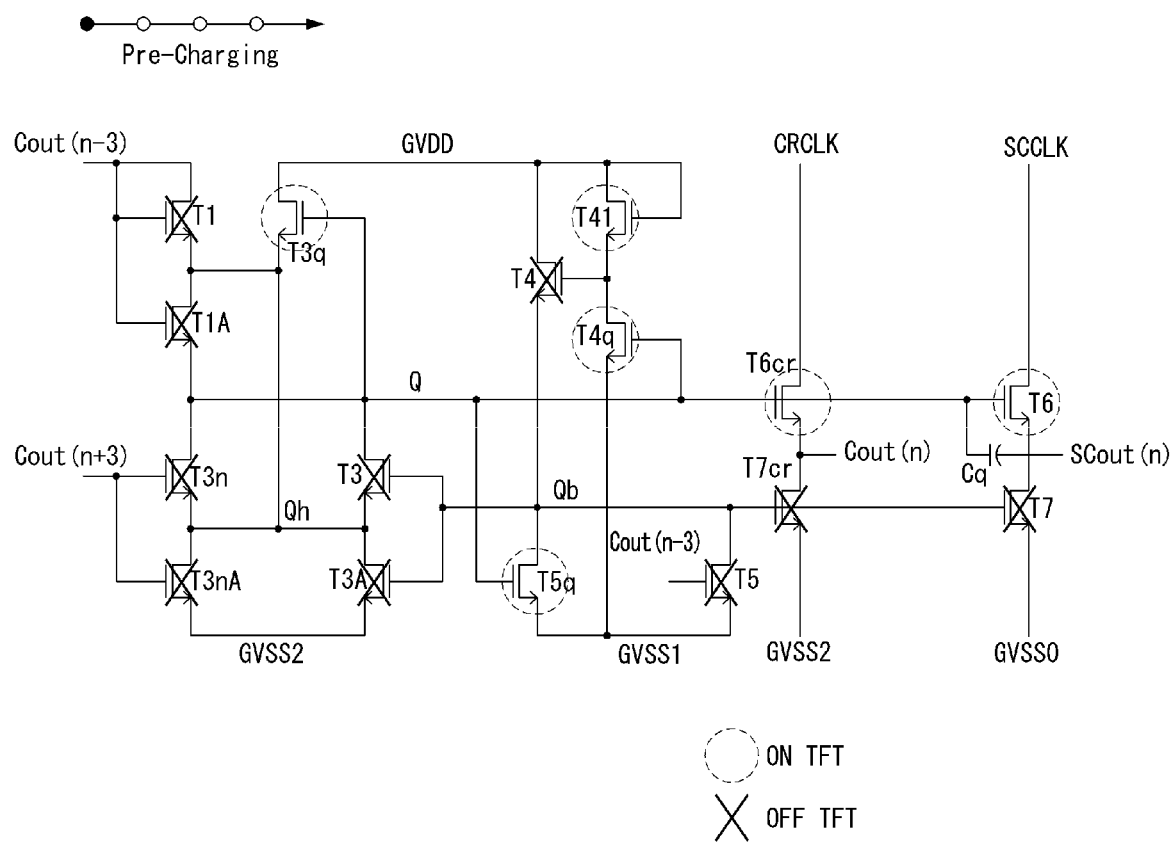
Figure 11:
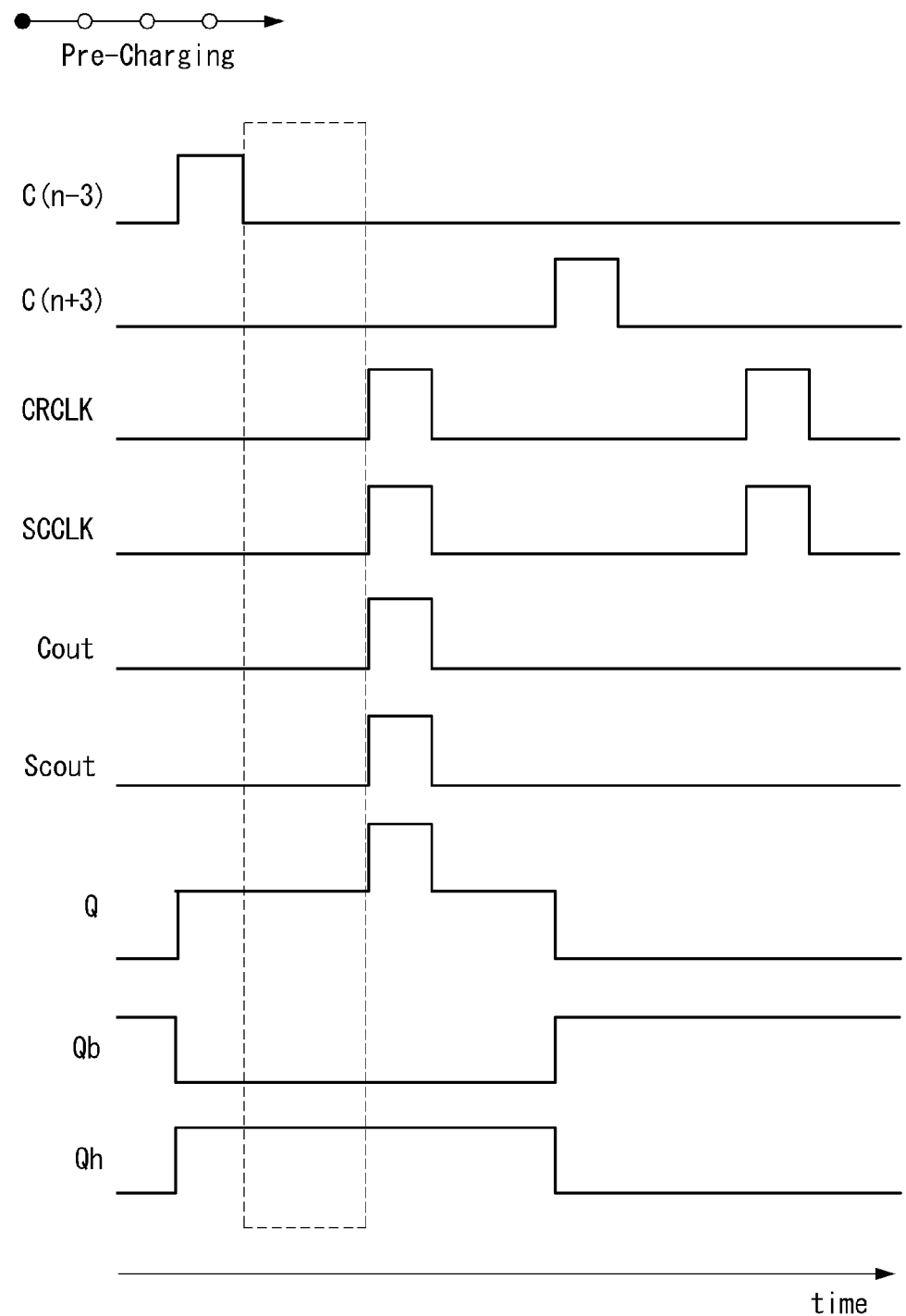
Figure 12:
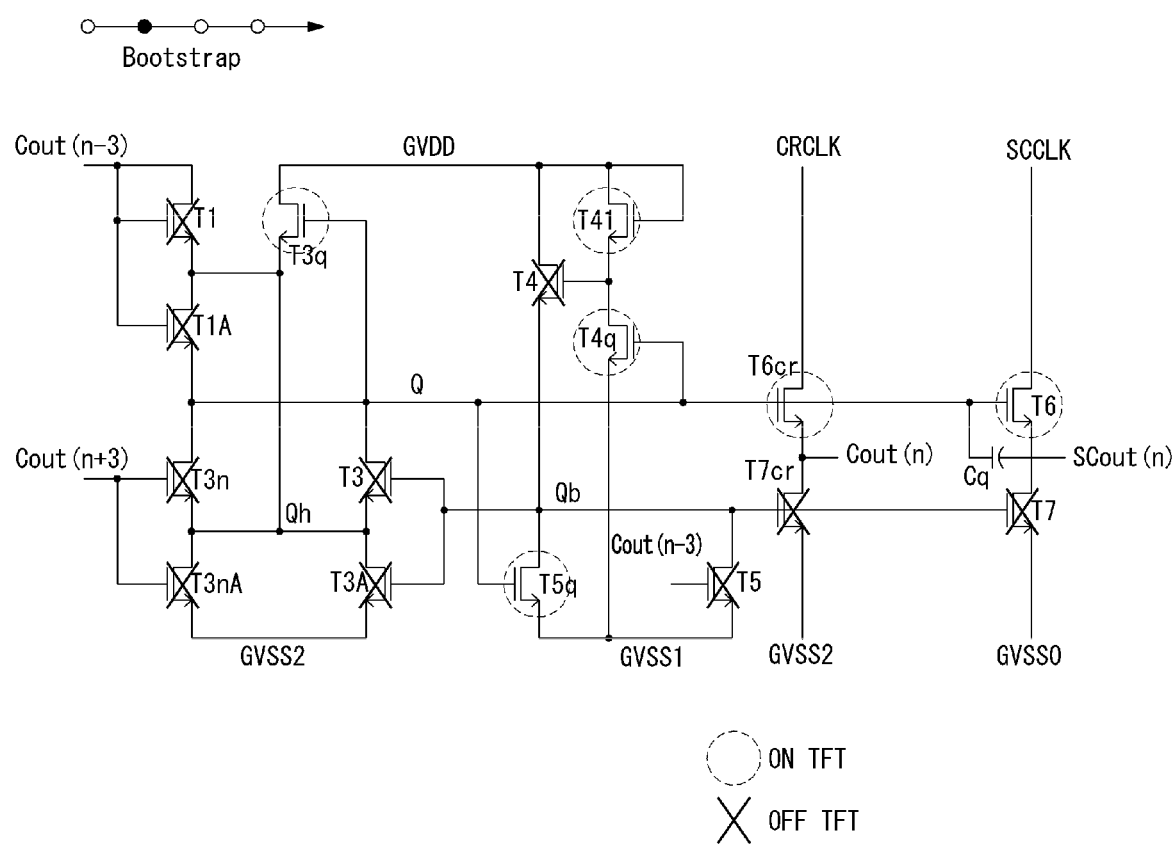
Figure 13:
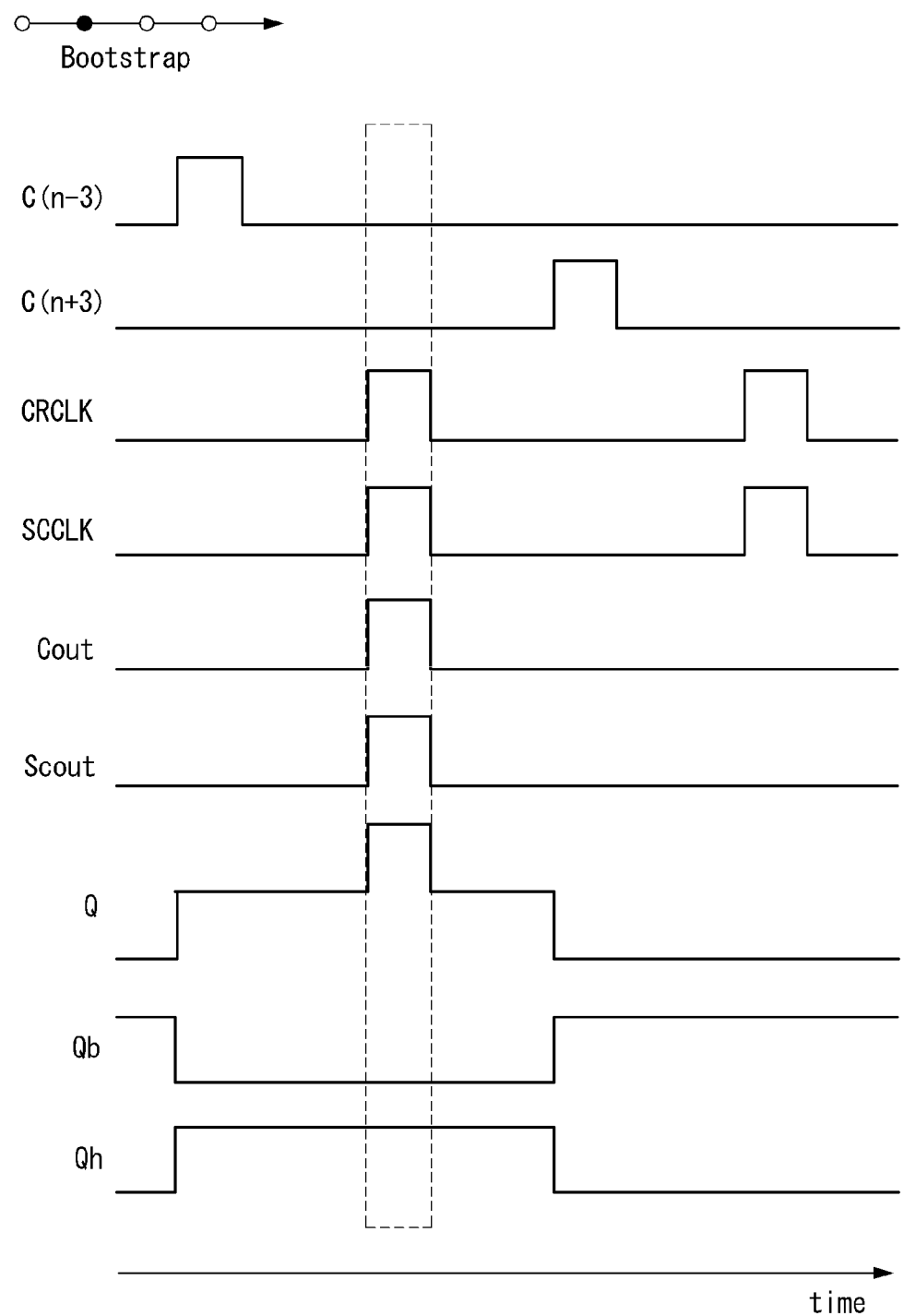
Figure 14:
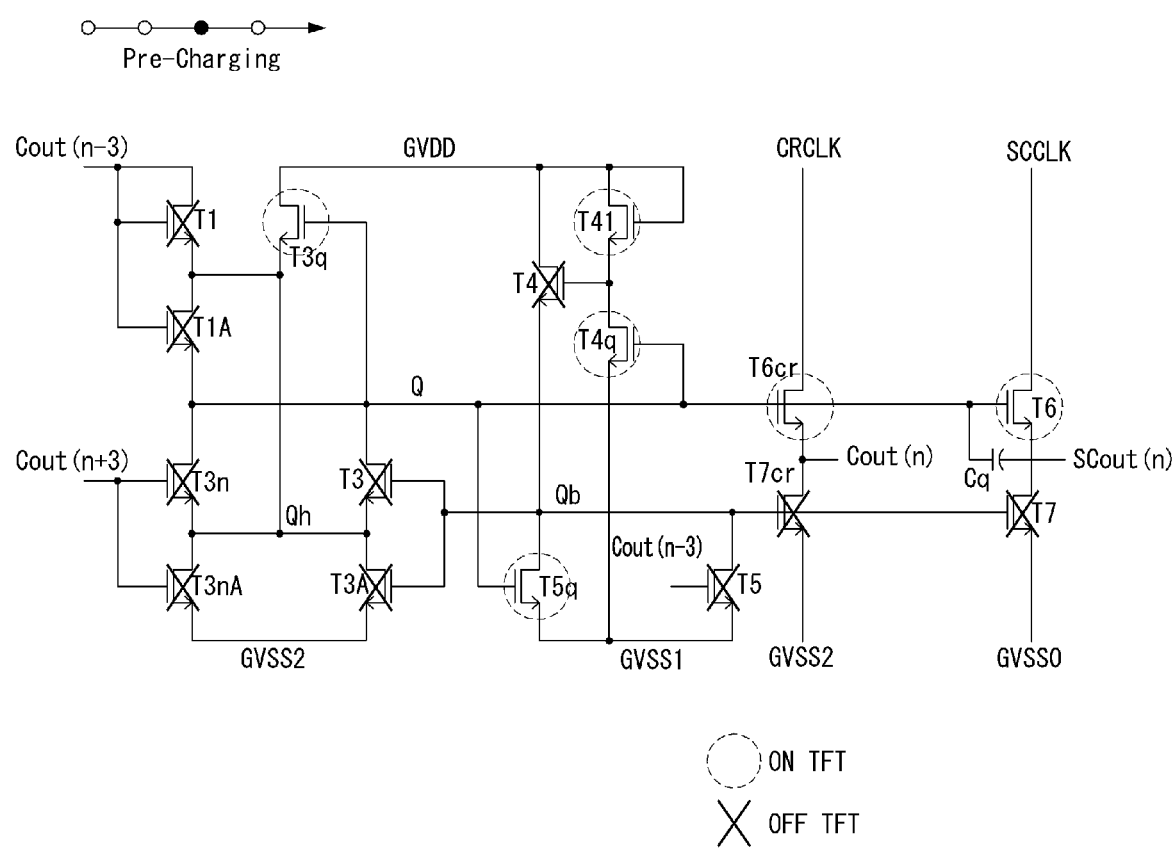
Figure 15:
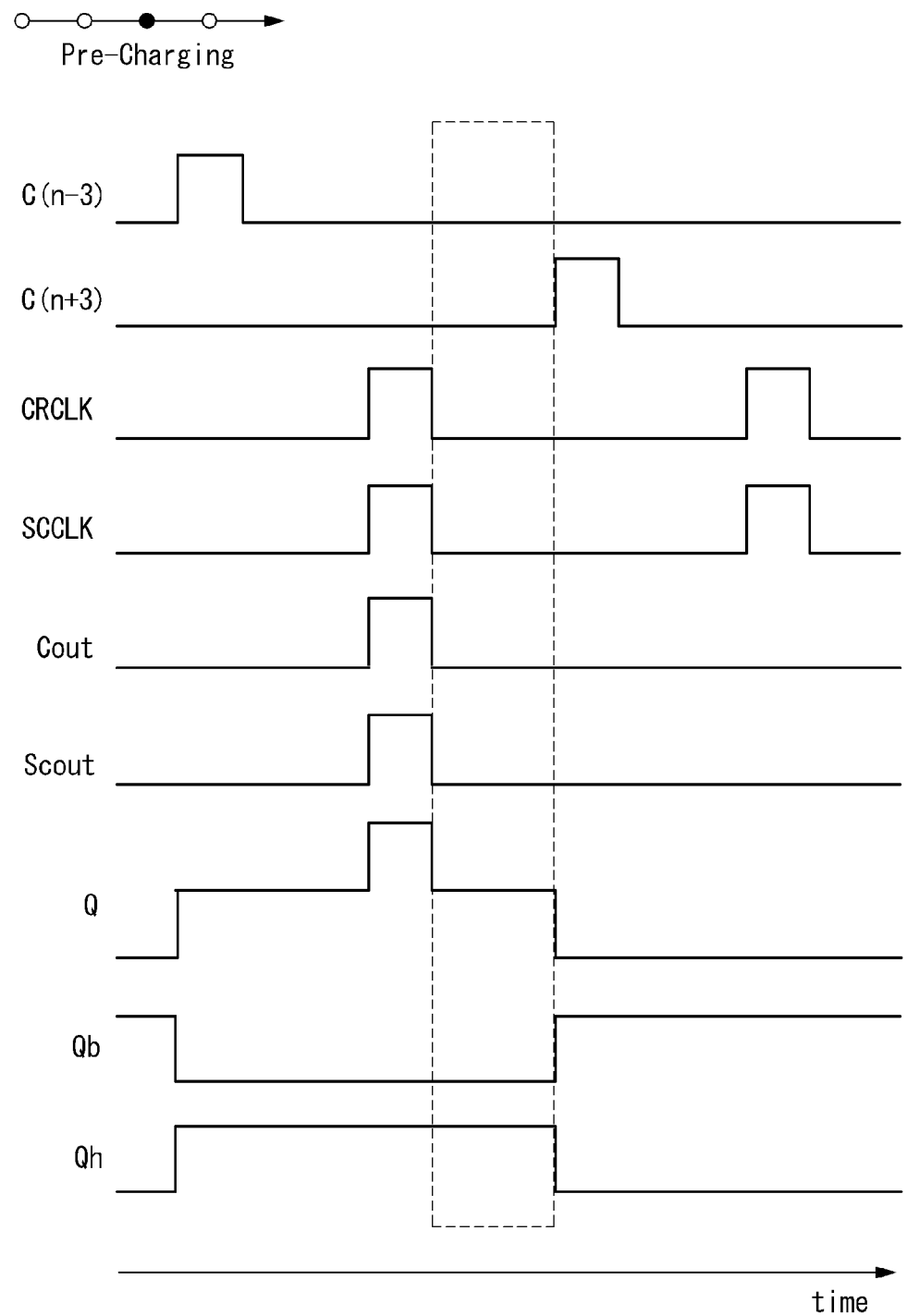

FIGS. 8 to 19 are diagrams illustrating an operation of the stage of FIG. 5. FIGS. 8 to 11 are diagrams illustrating a first precharging duration of the Q node and the Qh node. FIGS. 12 and 13 are diagrams illustrating a bootstrapping duration of the Q node. FIGS. 14 and 15 are diagrams illustrating a second precharging duration of the Q node. FIGS. 16 to 19 are diagrams illustrating a voltage holding duration of the Q node, Qh node, and Qb node.

Figure 8:
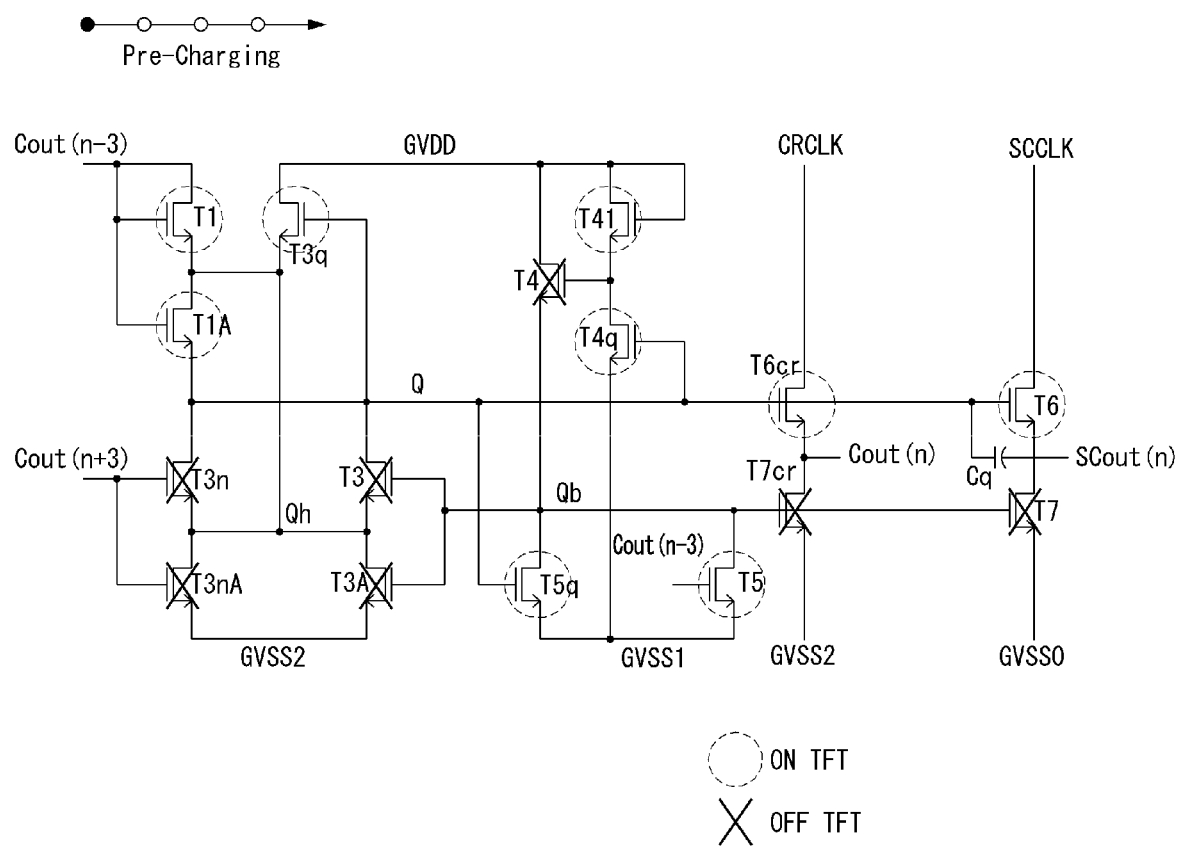
FIGS. 8 to 19 are diagrams illustrating an operation of the stage of FIG. 6.
Figure 9:
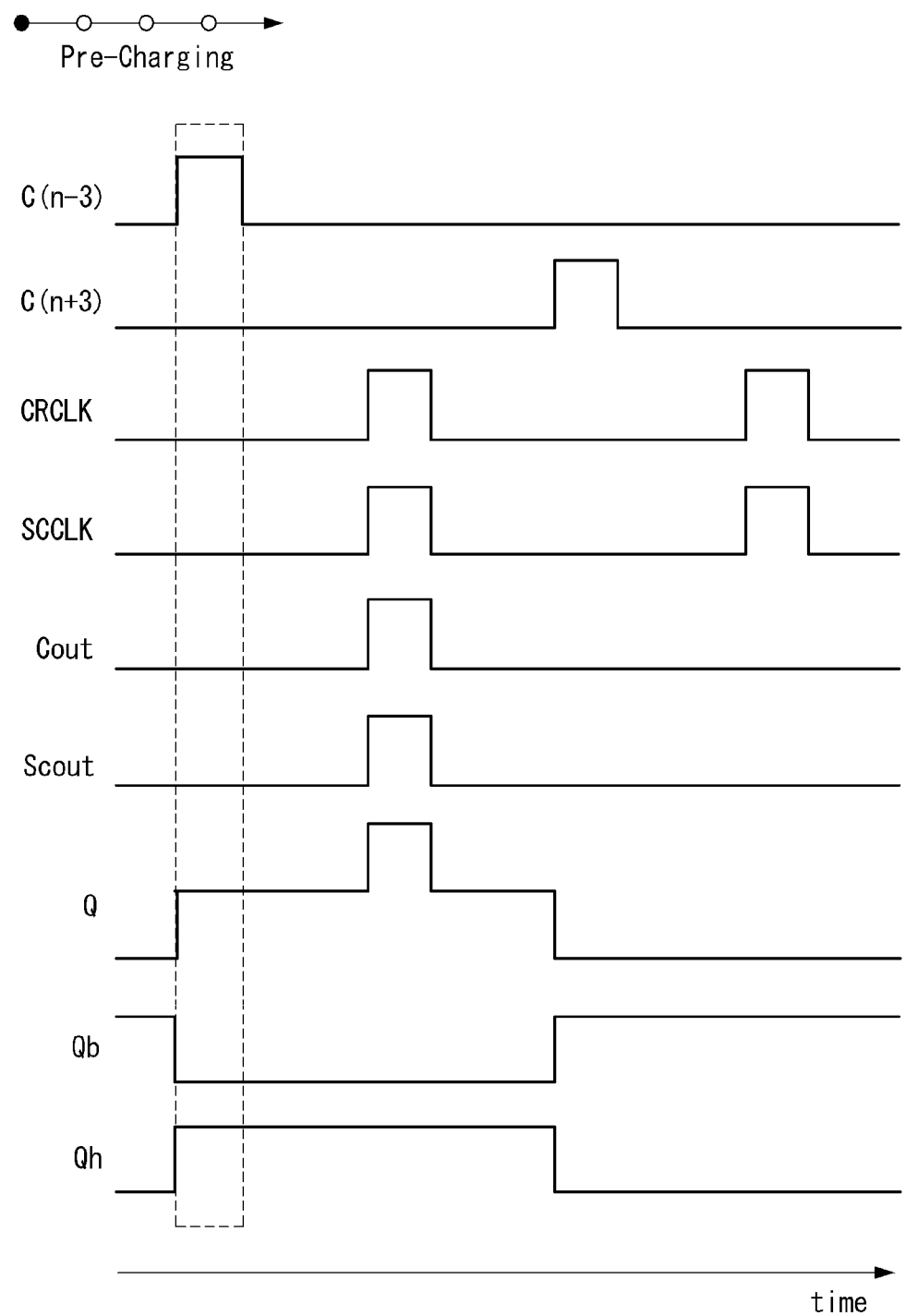

Referring to FIGS. 8 and 9, if a VGH voltage of the carry signal Cout(n−3) is input to a n-th stage of the gate driving circuit, the TFTs T1, T1A, and T5 are turned on and the voltages of the Q node and the Qh node are precharged by the gate high voltage VGH of the carry signal Cout(n−3) and simultaneously the Qb node is discharged. As a result, the TFTs T3q, T4q, T5, T5q, T6cr, and T6 are turned on. The TFT T41 operates as a diode and maintains an ON state while the voltage VGH is applied to a GVDD node.

Referring to FIGS. 10 and 11, the voltage of the carry signal Cout(n−3) is lowered to a VGL voltage. As a result, the TFTs T1, T1A, and T5 are turned off and the Q node, the Qh node, and the Qb node enter a floating state so that the nodes maintain a previous state.

Referring to FIGS. 12 and 13, VGH voltages of clocks SCCLK and CRCLK are applied to an n-th stage of the gate driving circuit. As a result, the voltage of the Q node is raised to a voltage higher than VGH by bootstrapping and a current Ids between the drain and source of each of the pull-up transistors T6 and T6cr is raised so that the voltage of the first and second output terminals are raised. In this case, the gate pulse SCout(n) and the carry signal Cout(n) are output from the n-th stage.

Referring to FIGS. 14 and 15, voltages of the clocks SCCLK and CRCLK are lowered to VGL. As a result, the voltage of the Q node is lowered to VGL and the voltage of a Qb node maintains VGL. The voltage of the Qh node maintains VGH.

Figure 16:
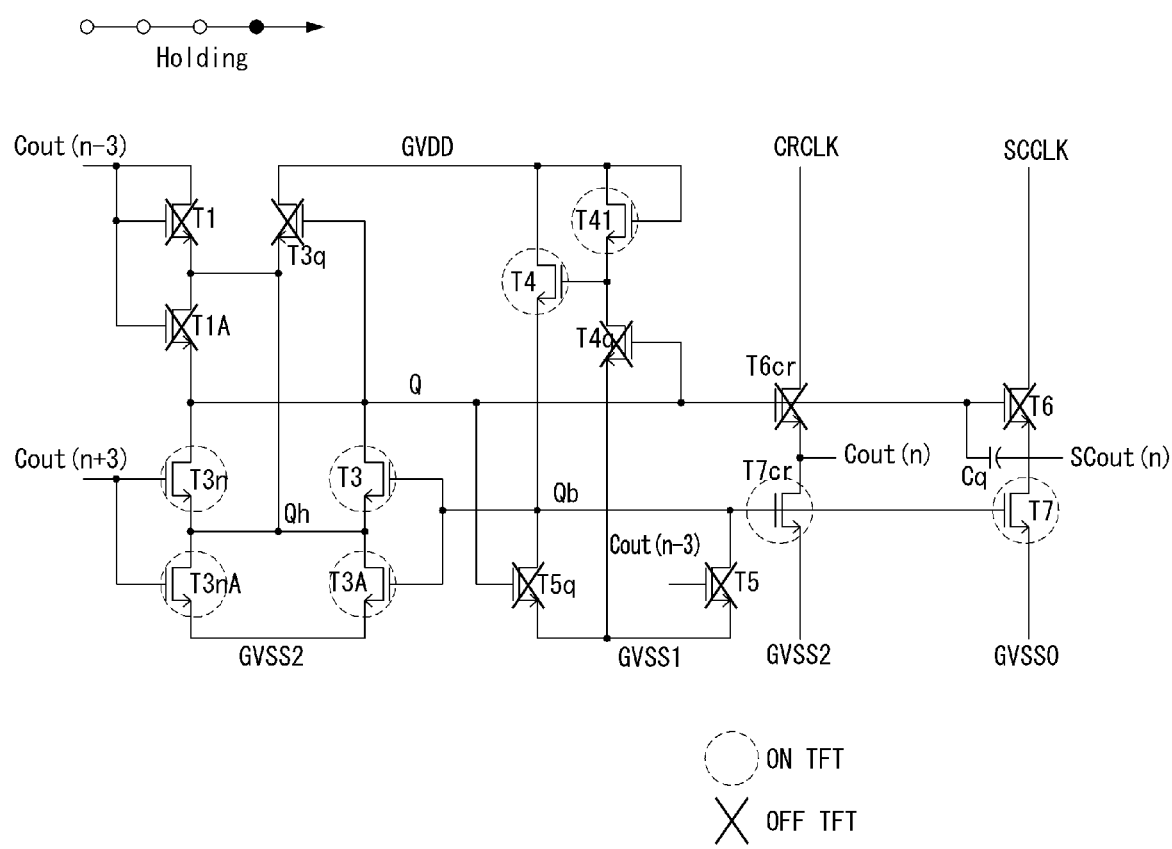
Figure 17:
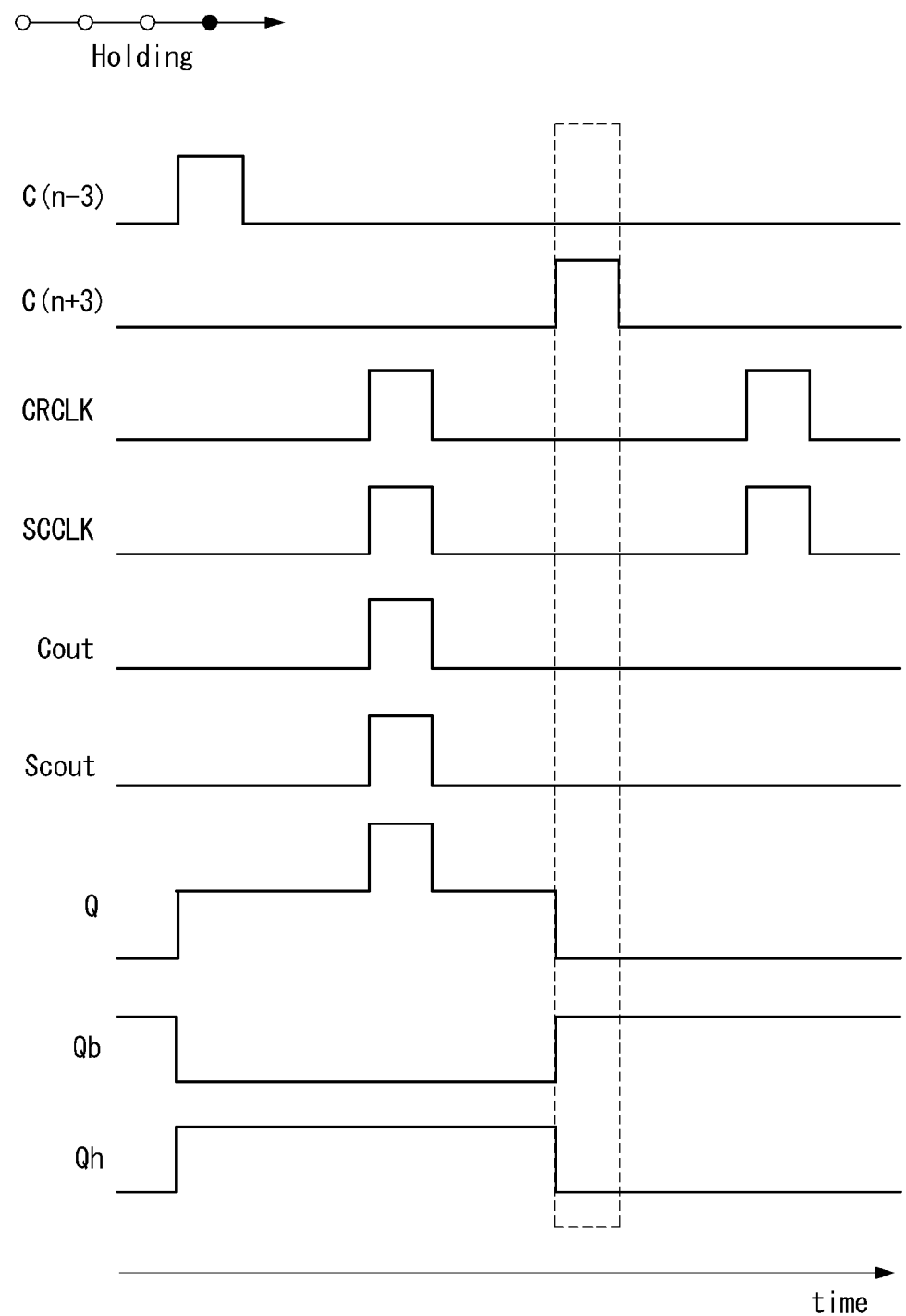

Referring to FIGS. 16 and 17, a VGH voltage of the carry signal Cout(n+3) is input to the n-th stage. In this case, the TFTs T3n and T3nA are turned on and the Q node and the Qh node are discharged. In addition, the TFTs T3q, T4q, T6, and T6cr are turned off and the Qb node is charged so that the TFTs T3, T3A, T7, and T7cr are turned on. As a result, the voltage of the gate pulse SCout(n) is lowered to VGL0 and the voltage of the carry signal Cout(n) is lowered to VGL2.

Figure 18:
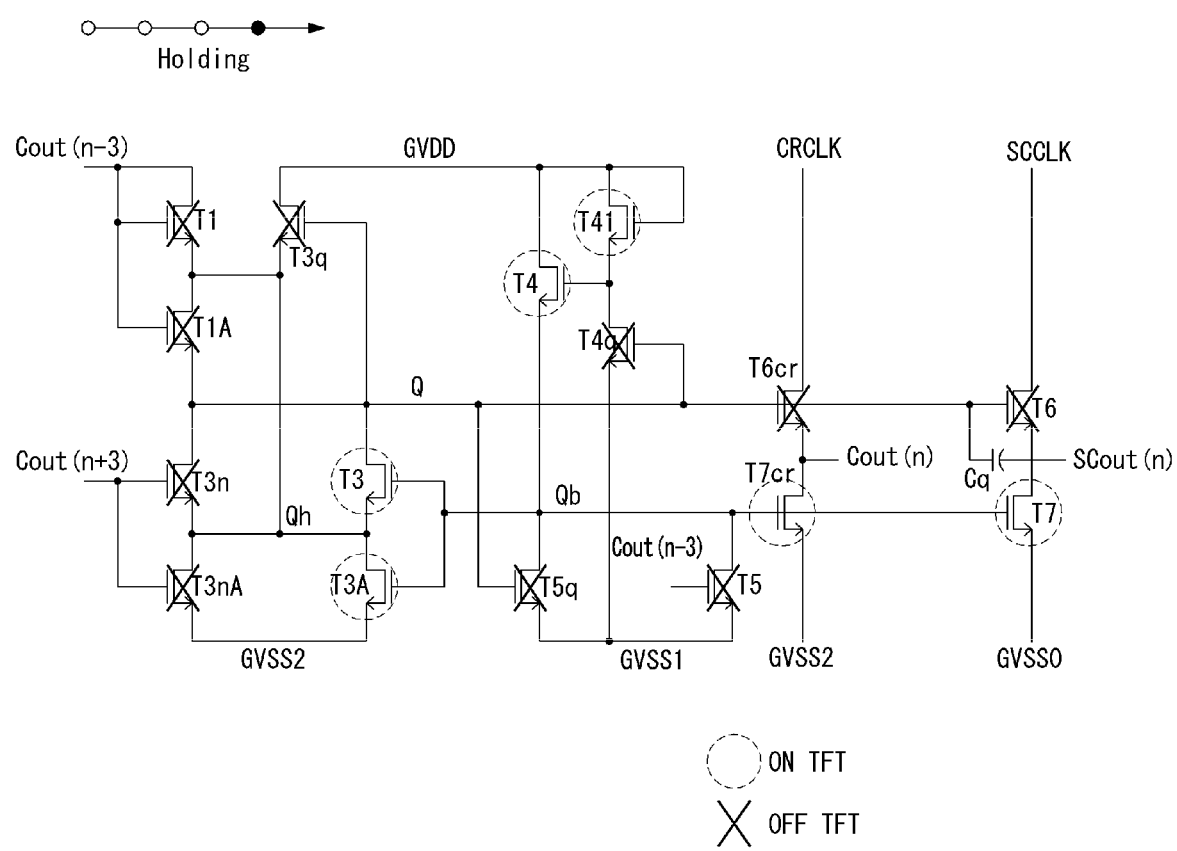
Figure 19:
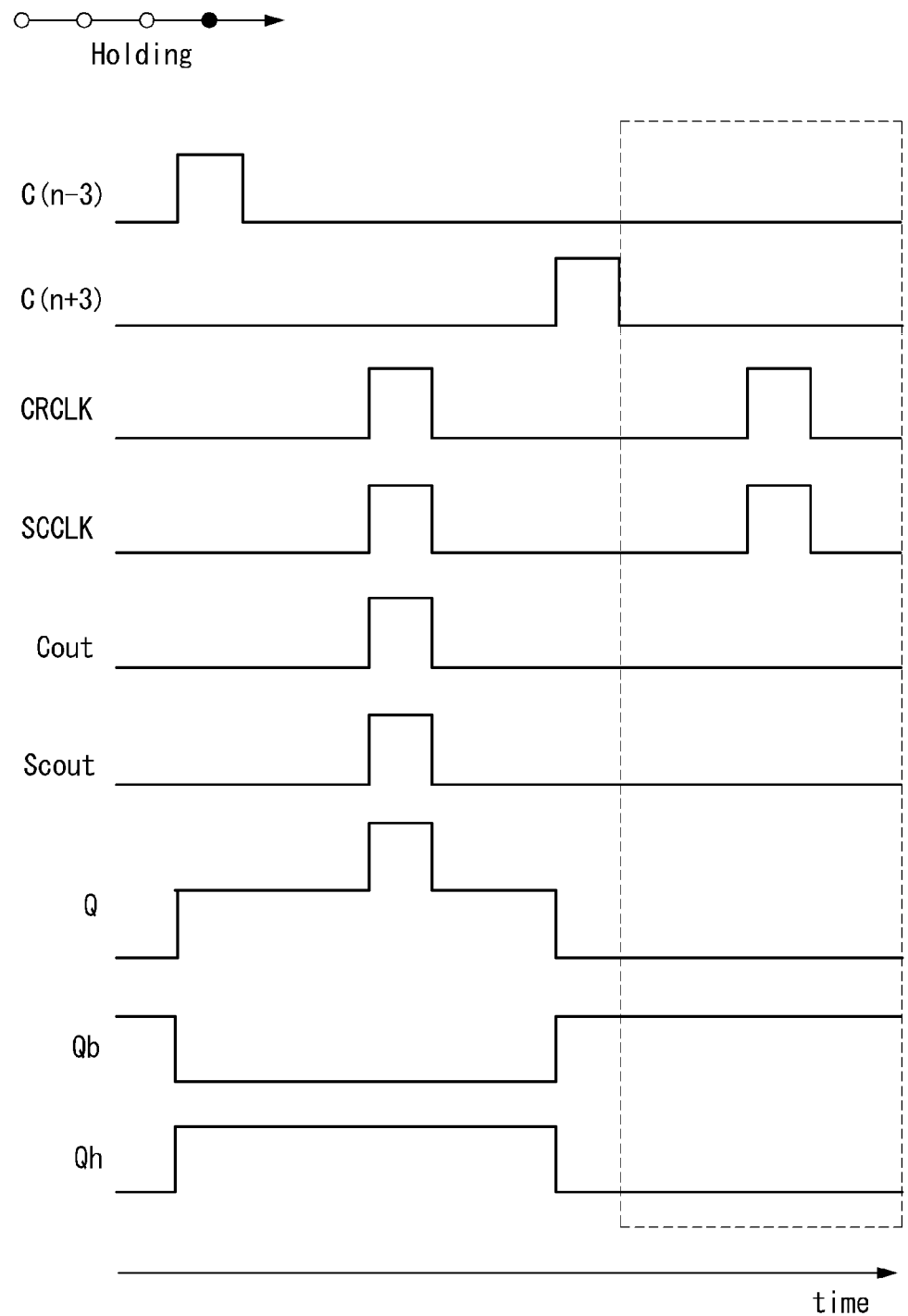

Referring to FIGS. 18 and 19, the voltage of the carry signal Cout(n+3) is lowered to VGL. In this case, the TFTs T3n and T3nA are turned off. The Q node, the Qh node, and the Qb node enter a floating state. As a result, the voltage of the gate pulse SCout(n) is maintained at VGL0 and the voltage of the carry signal Cout(n) is maintained at VGL2.

While FIG. 6 illustrates the stage as being driven with 6 phases, the stage according to the present disclosure is not limited thereto and may be configured in various manners.

As illustrated in FIG. 6, the stage includes 16 transistors and 1 capacitor.

Accordingly, if a unit element (e.g., a transistor or a capacitor) constituting the stage is distributively disposed in one subpixel region, one stage for driving one gate line (or scan line) may be disposed.

Figure 20:
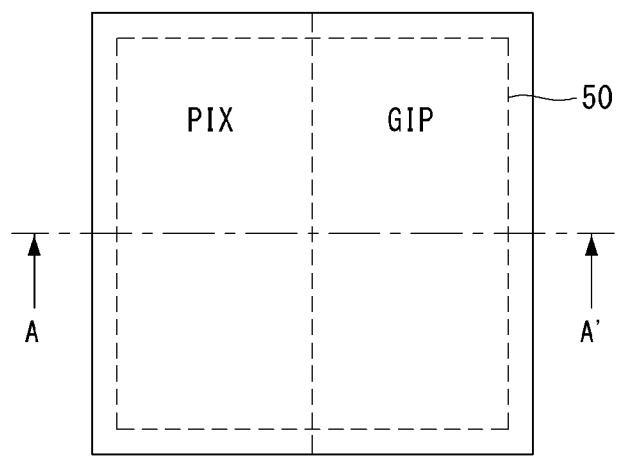
FIG. 20 is a plan view illustrating one subpixel according to a first embodiment of the present disclosure.
Figure 21:
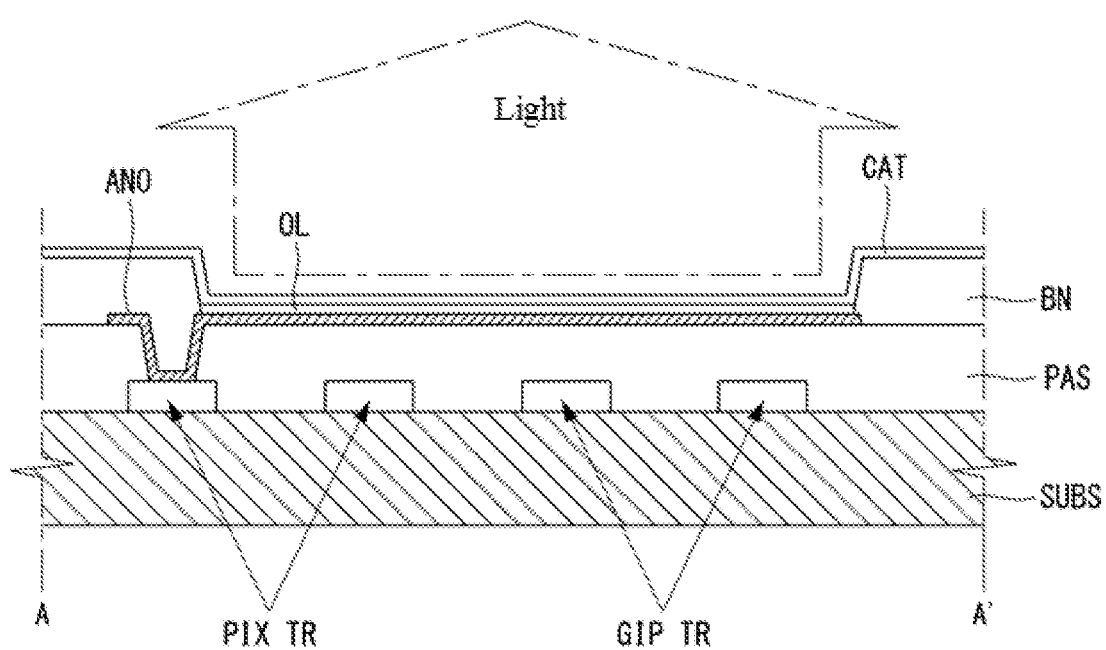
FIG. 21 is a view illustrating a pixel circuit unit and a GIP circuit unit of the subpixel taken along line "A-A'" in FIG. 20.

FIG. 20 is a plan view illustrating one subpixel according to a first embodiment of the present disclosure. FIG. 21 is a view illustrating a pixel circuit unit and a GIP circuit unit of the subpixel taken along line "A-A'" in FIG. 20. In FIG. 21, "PIX TR" denotes the pixel circuit unit including TFTs and "GIP TR" denotes the GIP circuit unit including TFTs. In the TFTs of the pixel circuit unit PIX TR and the GIP circuit unit GIP TR illustrated in FIG. 21, a detailed structure of electrodes and insulation layers is omitted.

Referring to FIGS. 20 and 21, each subpixel includes the pixel circuit unit PIX TR and the GIP circuit unit GIP TR. In each subpixel, an OLED includes an organic compound layer OL disposed between an anode ANO and a cathode CAT. The anode may be formed of silver (Ag), an Ag alloy, or a multilayer metal electrode including at least one of Ag and Ag alloy. The cathode may be formed of metal such as Al, MgAg, Indium Zinc Oxide (IZO), etc. The anode is a metal electrode which emits light. The cathode is a metal electrode into which light is transmitted.

Each of the pixel circuit unit PIX TR and the GIP circuit unit GIP TR includes one or more TFTs. The TFTs included in the pixel circuit unit PIX TR and the GIP circuit unit GIP TR may be one or more TFTs among TFTs including amorphous silicon (a-Si), oxide TFTs including an oxide semiconductor, and TFTs including a Low-Temperature Polycrystalline Silicon (LTPS).

In each subpixel, a light-emitting element, i.e., an OLED, includes the anode ANO disposed on TFTs of the pixel circuit unit and TFTs of the GIP circuit unit, the organic compound layer OL deposited on the anode ANO, and the cathode CAT disposed on the organic compound layer OL.

In each of the subpixels, the OLED covers the pixel circuit unit PIX TR and the GIP circuit unit GIP TR. Light emitted from the organic compound layer OL is externally emitted through the cathode CAT. In addition, light emitted from the organic compound layer OL is reflected from the anode ANO and is externally emitted through the cathode CAT. Light is generated from the light-emitting element disposed on the pixel circuit unit and the GIP circuit unit and is emitted towards the opposite side of the pixel circuit unit and the GIP circuit unit. Therefore, in each subpixel, since a light-emitting area includes the pixel circuit unit and the GIP circuit unit, the light-emitting area is not reduced.

The pixel circuit unit PIX TR and the GIP circuit unit GIP TR are disposed on a substrate SUBS of the display panel PNL and a passivation layer PAS covers the pixel circuit unit PIX TR and the GIP circuit unit GIP TR. The pixel circuit unit PIX TR and the GIP circuit unit GIP TR are covered by the OLED formed on the passivation layer PAS.

Figure 22:
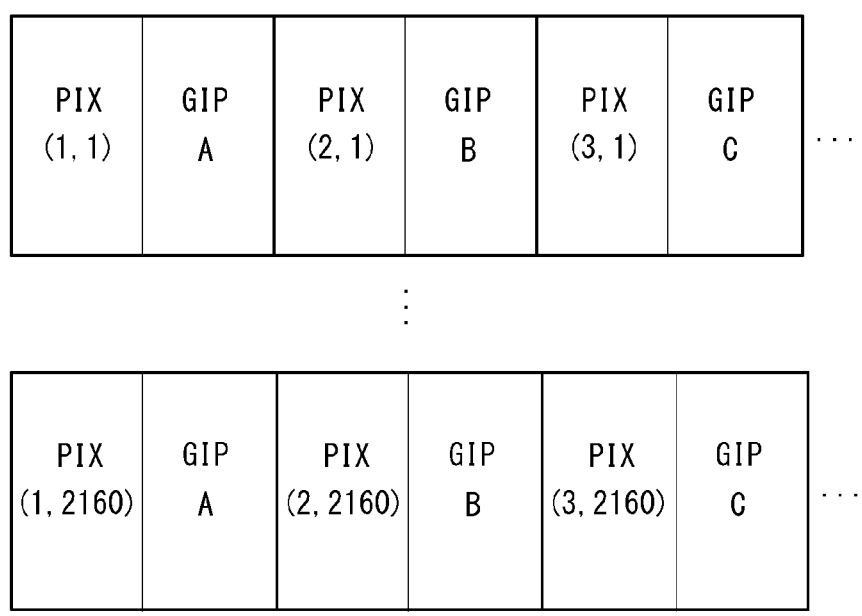
FIG. 22 is a diagram illustrating a GIP circuit unit and a pixel circuit unit formed in each subpixel in an display region.

FIG. 22 is a diagram illustrating a GIP circuit unit and a pixel circuit unit formed in each subpixel in a display region of the display panel PNL. In FIG. 22, "PIX(1.1)" to "PIX(3,2160)" denote pixel circuit units and "GIPA", "GIP B", and "GIP C" denote GIP circuit units.

Referring to FIGS. 22 to 25, each subpixel is divided into the pixel circuit unit and the GIP circuit unit. TFTs and wirings of the pixel circuit unit are spatially separated from TFTs and wirings of the GIP circuit unit so that interference between the pixel circuit unit and the GIP circuit unit is minimized, and each subpixel is advantageous in terms of yield. Wirings VDL, VSL, and DL1 to DL4 of the pixel circuit unit are separated from wirings VGL, VGH, CLKA, and CLKB of the GIP circuit unit without overlapping with each other. For example, the TFTs and the data lines DL1 to DL4 constituting the pixel circuit unit are spatially separated from the TFTs and clock wirings constituting the GIP circuit unit.

Figure 23:
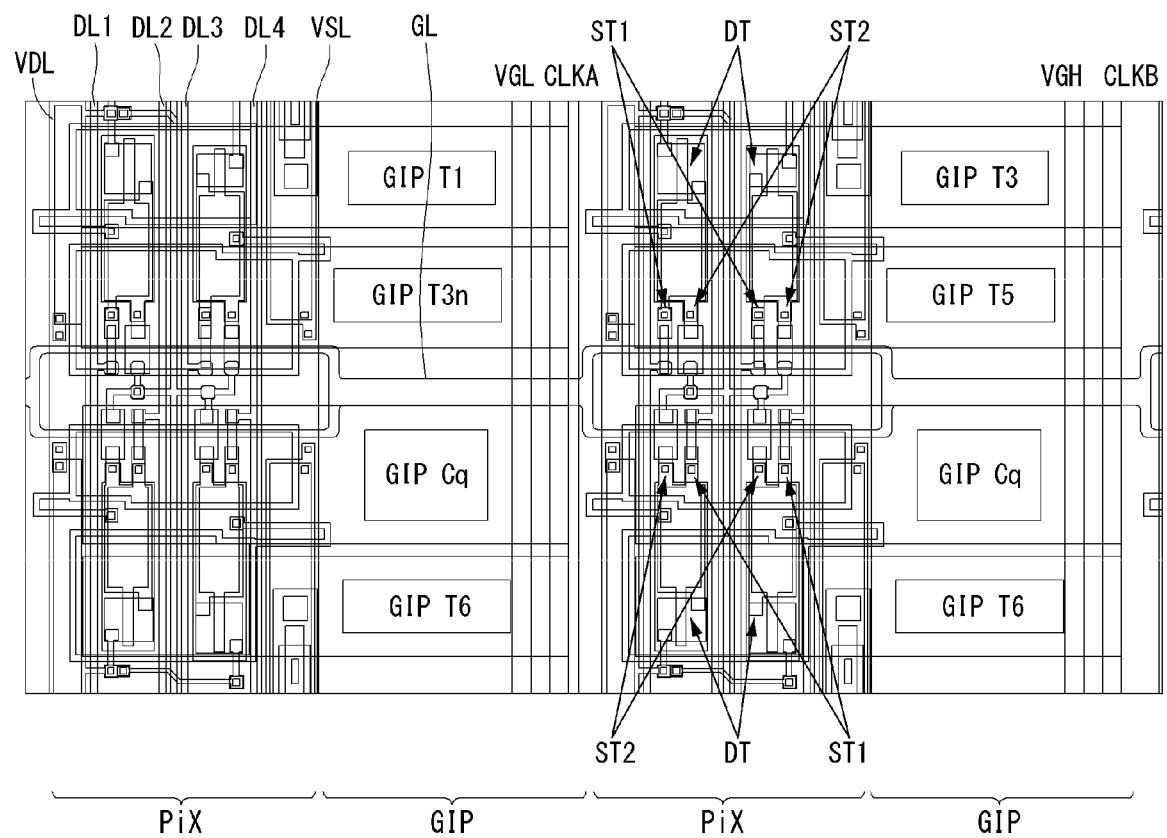
FIGS. 23 to 25 are diagrams illustrating plane structures of subpixels in detail.
Figure 24:
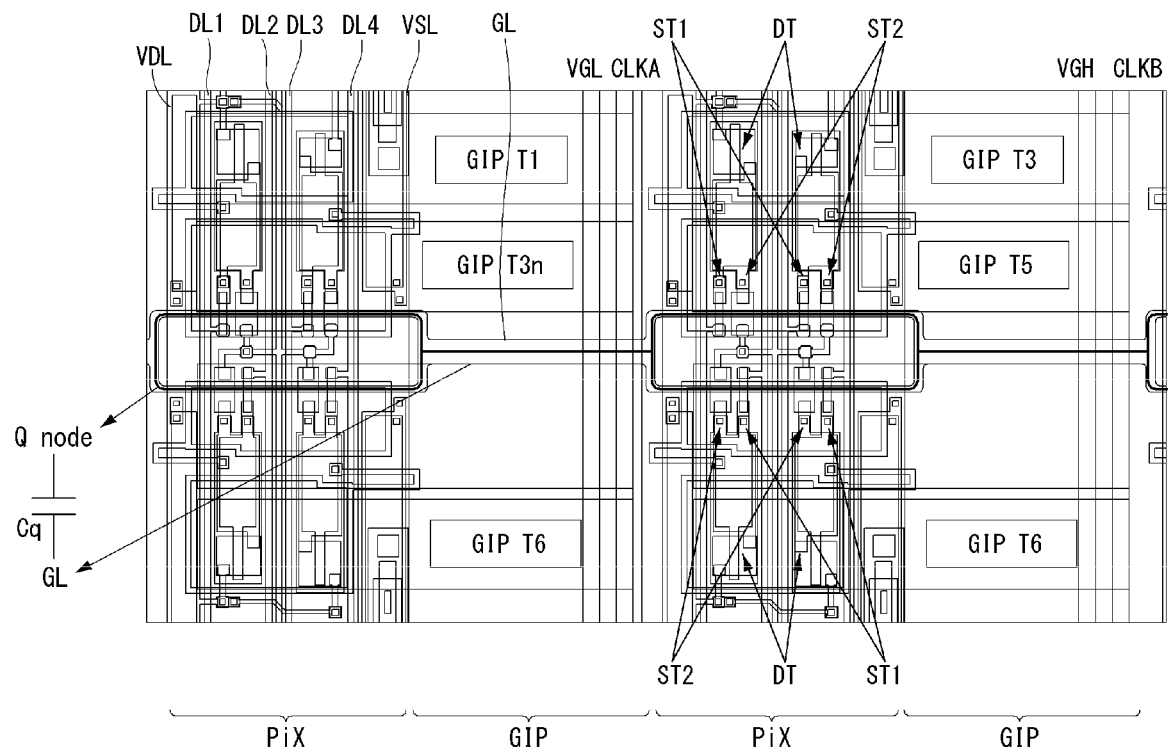

In FIGS. 23 and 24, VDL denotes a power supply wiring to which a first constant voltage EVDD is applied and VSL denotes a power supply wiring to which a second constant voltage EVSS is applied. The data lines DL1 to DL4 are provided with data voltages. The first data line DL1 is connected to a red subpixel R to supply a red data voltage to the red subpixel R. The second data line DL2 is connected to a white subpixel W to supply a white data voltage to the subpixel W. The third data line DL3 is connected a blue subpixel B to supply a blue data voltage to a blue subpixel B. The fourth data line DL4 is connected to a green subpixel G to supply a green data voltage to a green subpixel G.

In FIG. 24, VGL denotes a VGL wiring which is connected to the VSS nodes GVSS0, GVSS1, and GVSS2 in the stage of FIG. 6 to supply a gate low voltage VGL. VGH denotes a VGH wiring which is connected to the VDD node GVDD in the stage of FIG. 6 to supply a gate high voltage VGH. CLKA and CLKB are clock wirings to which clocks CRCLK and SCCLK in the stage of FIG. 6 are applied.

The elements of the GIP circuit unit are larger in number than the elements of the pixel circuit unit, and the GIP circuit unit occupies a larger circuit area than the pixel circuit unit. Accordingly, one stage circuit which generates one output in the gate driving circuit may be distributively disposed in a plurality of subpixels. In the example of FIG. 22, a subpixel (1,1) may include a pixel circuit unit PIX(1,1) and a part GIP A of the GIP circuit unit, and a subpixel (2,1) may include a pixel circuit unit PIX(2,1) and another part GIP B of the GIP circuit unit. In the example of FIG. 23, GIP A includes the TFTs T1, T3n, and T6, the capacitor Cq, etc. in the stage of FIG. 6. GIP B includes the TFTs T3, T5, and T6, the capacitor Cq, etc. in the stage of FIG. 6. The capacitor Cq may be implemented as a large-capacitance capacitor in order to reduce ripple of the Q node and the output signal. Herein, since the capacitance of the capacitor Cq increases, the capacitor Cq may be shared by neighboring subpixels.

Figure 25:
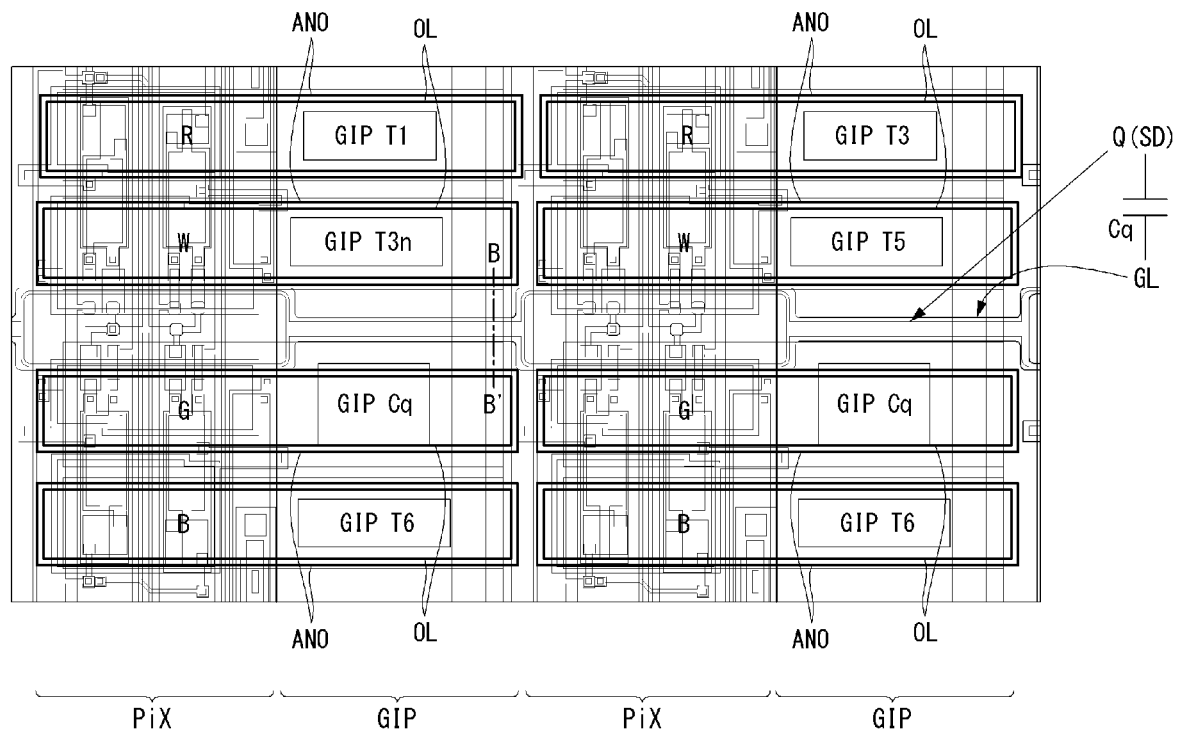

In the examples of FIGS. 24 and 25, when the GIP circuit unit is arranged in a subpixel, the Q node of the stage may overlap with a gate line GL so that the capacitor Cq may be formed between the Q node and the gate line GL. The gate line GL is connected to an output terminal through which a gate pulse in the stage is output. According to a capacitor design method illustrated in FIGS. 24 and 25, the gate line GL may be used as a design area of the capacitor Cq and interference between the pixel circuit unit and the Q node of the stage can be prevented.

As illustrated in FIG. 25, in each subpixel, an anode ANO and an organic compound layer OL of an OLED are disposed on the pixel circuit unit PIX and the GIP circuit unit GIP. In each subpixel, the size of each of the patterns of the anode ANO and the organic compound layer OL is larger than the size of the pixel circuit unit PIX and is substantially the same as the size of the sum of the pixel circuit unit PIX and the GIP circuit unit GIP. The pattern of each of the anode ANO and the organic compound layer OL formed on the pixel circuit unit PIX and the GIP circuit unit GIP is connected continuously (or without being disconnected). Accordingly, an aperture ratio and a light-emitting area in each subpixel are larger than the pixel circuit unit PIX and there is no reduction in the aperture ratio and light-emitting area as compared with a conventional subpixel without having the GIP circuit unit.

Figure 26:
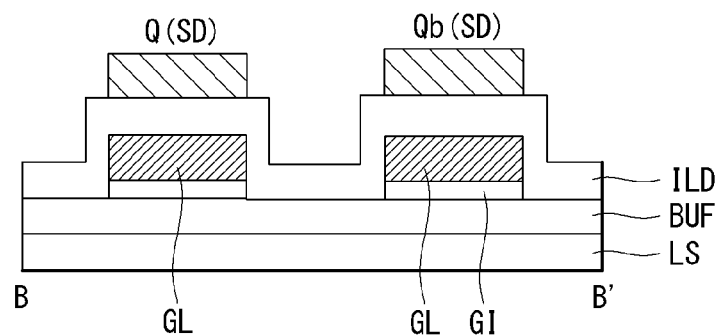
FIG. 26 is a cross-sectional view of a Q node and a Qb node of a GIP circuit unit disposed on a gate line GL, taken along line "B-B" in FIG. 25.

FIG. 26 is a cross-sectional view of a Q node and a Qb node of a GIP circuit disposed on a gate line GL, taken along line "B-B" in FIG. 25.

Referring to FIG. 26, each of the Q node and the Qb node of the stage may be formed of the gate line GL and a second metal pattern SD overlapping with the gate line GL. The gate line GL and the second metal pattern SD overlap with each other with an interlayer insulating layer ILD disposed therebetween. In FIG. 26, a light shield layer LS is formed on a substrate (not illustrated) and a buffer layer BUF is formed on the light shield layer LS. A gate insulating layer GI is disposed between the buffer layer BUF and the gate line GL.

Figure 27:
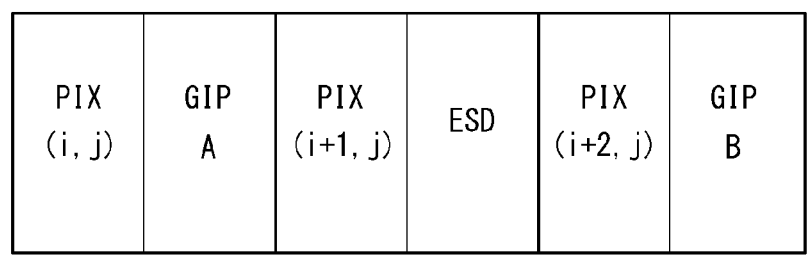
FIG. 27 is a diagram illustrating a pixel structure according to a second embodiment of the present disclosure.

FIG. 27 is a diagram illustrating a pixel structure according to a second embodiment of the present disclosure. FIG. is a circuit diagram illustrating an example of an electrostatic discharge protection element ESD illustrated in FIG. 27.

Figure 28:
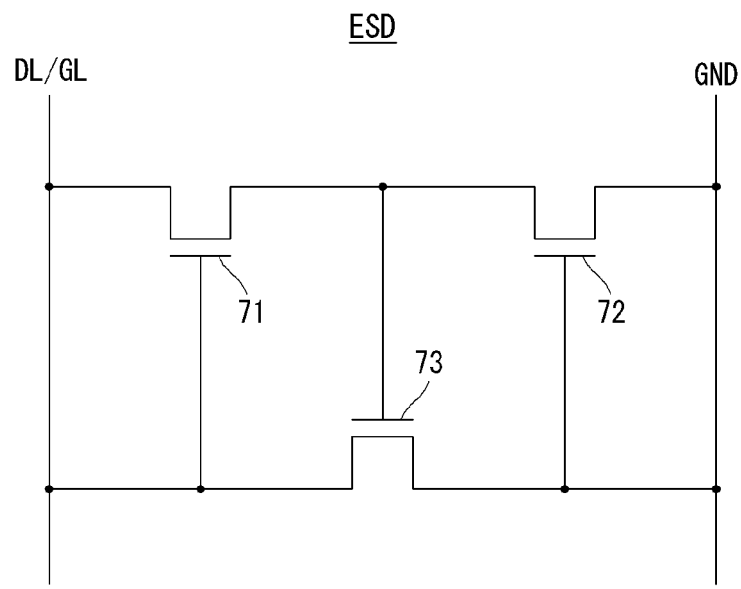
FIG. 28 is a circuit diagram illustrating an example of an electrostatic discharge protection element illustrated in FIG. 27.

Referring to FIGS. 27 and 28, when the GIP circuit unit is distributively disposed in each subpixel, since the GIP circuit unit needs not be added to a part of subpixels, the remaining space may be present in partial subpixels. In this case, the electrostatic discharge protection element ESD as illustrated in FIG. 28 may be disposed in partial subpixels. Generally, since the electrostatic discharge protection element ESD is disposed in a bezel area of a display panel, the electrostatic discharge protection element ESD serves as a factor restricting reduction in bezel. If the electrostatic discharge protection element ESD is disposed in subpixels in a display region, this is favorable for narrow bezel design.

The electrostatic discharge protection element ESD is connected between signal wirings DL/GL and a ground wiring GND of a display panel PNL. In a subpixel in which the electrostatic discharge protection element ESD is disposed, the anode ANO and the organic compound layer OL of the OLED may be patterned such that a pixel circuit unit PIX(i+1, j) and the electrostatic discharge protection element ESD are covered by the anode ANO and the organic compound layer OL formed on the pixel circuit unit(PIX(i+1, j) and the electrostatic discharge protection element ESD. Accordingly, there is no reduction in an aperture ratio and a light-emitting region in this subpixel. In this subpixel, the aperture ratio and the light-emitting region may be larger than the pixel circuit unit PIX(i+1, j).

Although the electrostatic discharge protection element ESD is implemented by the circuit as illustrated in FIG. 24, the present disclosure is not limited thereto. In the example of FIG. 28, the electrostatic discharge protection element ESD includes two switching TFTs 71 and 72 and one equalizer TFT 73. The first and second switching TFTs 71 and 72 operate as diodes and cut off a phenomenon in which current simultaneously flows in both directions. The equalizer TFT T73 is disposed between the first and second switching TFTs 71 and 72.

Meanwhile, if one unit element (e.g., a transistor or a capacitor) constituting the stage is distributively disposed in one unit pixel region, one stage for driving one gate line (or scan line) may be disposed. Red (R), green (G), and blue (B) subpixels may constitute one unit pixel or red (R), green (G), blue (B), and white (W) subpixels may constitute one unit pixel.

Obviously, elements (e.g., TFTs, capacitors, etc.) constituting one stage may be distributively disposed in a plurality of unit pixel regions arranged in one gate line. A detailed arrangement method of the stage will be described later.

Figure 29:
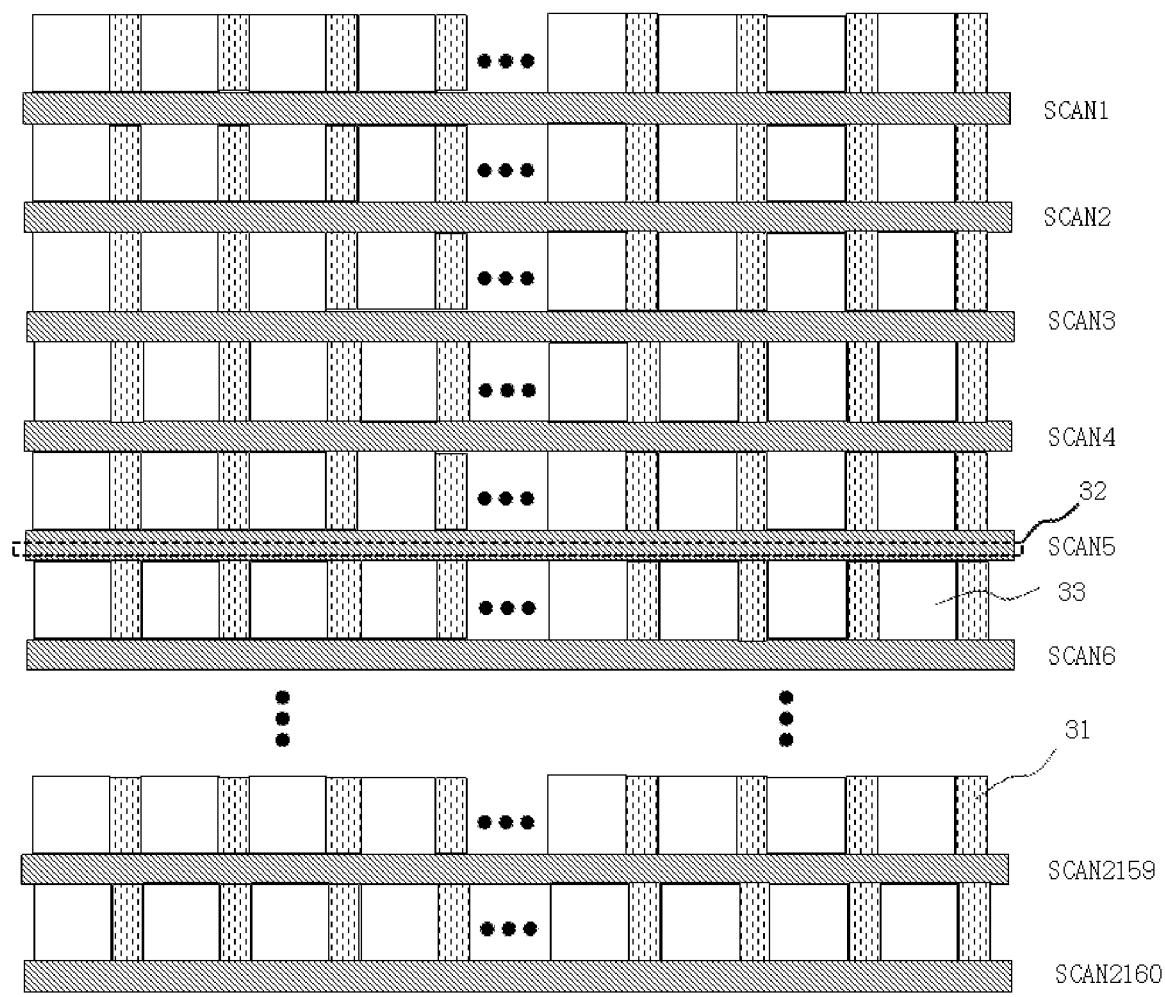
FIG. 29 is a diagram illustrating configuration of a display region of a display panel according to a third embodiment of the present disclosure.
Figure 30:
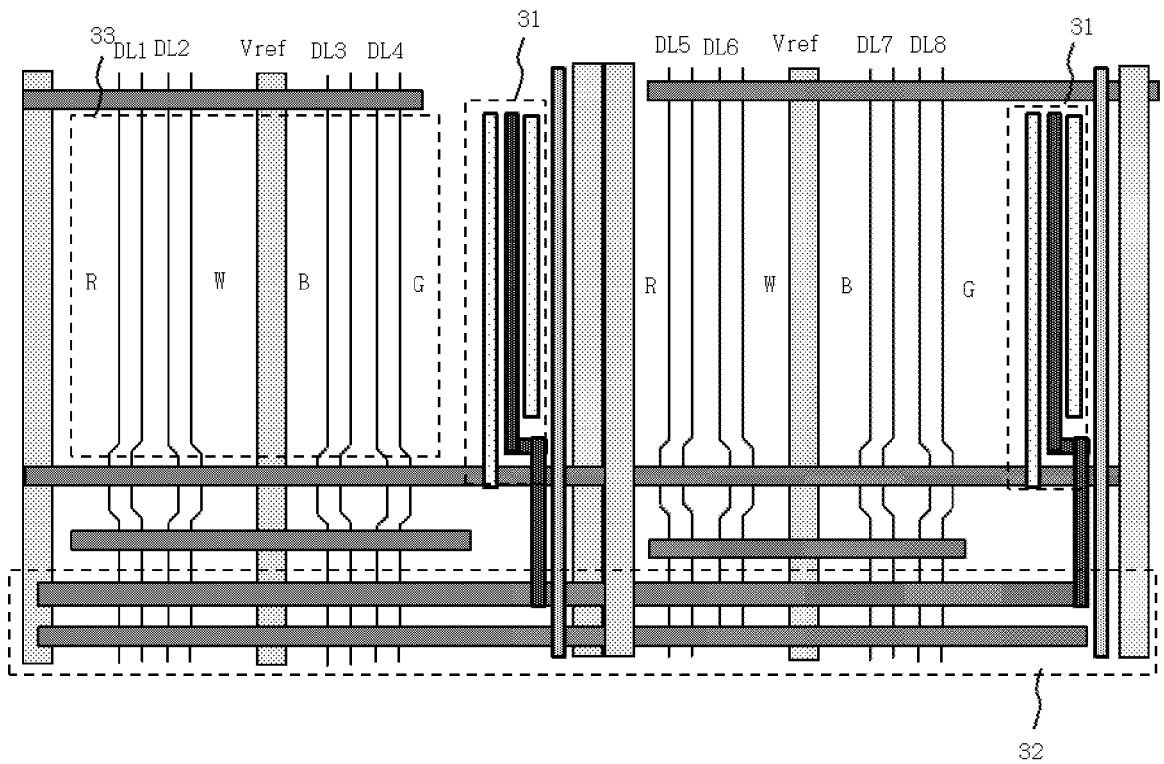
FIG. 30 is a diagram illustrating two adjacent unit pixels arranged in the display region of the display panel of FIG. 29 in detail.

FIG. 29 is a diagram illustrating configuration of a display region of a display panel according to a third embodiment of the present disclosure. FIG. 30 is a diagram illustrating two adjacent unit pixels arranged in the display region of the display panel of FIG. 29 in detail.

While, in FIGS. 29 and 30, a unit pixel consisting of red (R), green (G), blue (B), and white (W) subpixels is illustrated, the present disclosure is not limited thereto and the unit pixel may consist of red (R), green (G), and blue (B) subpixels.

A unit pixel region of the display region of the display panel according to the third embodiment of the present disclosure is divided into a pixel circuit unit 33 including at least three subpixel units R, G, B, and W, a GIP circuit unit 31, and a GIP internal connection wiring unit 32.

The at least three subpixel units R, G, B, and W are configured such that a plurality of data lines DL1 to DLm, a plurality of reference voltage lines Vref, and first and second constant voltage lines EVDD and EVSS are vertically arranged and a plurality of gate lines (scan lines) is horizontally arranged.

The GIP circuit unit 31 corresponds to an element (e.g., a transistor or a capacitor) constituting a stage of the gate driving circuit. That is, the element (e.g., a transistor or a capacitor) constituting the stage illustrated in FIG. 6 is distributively disposed in a unit pixel region consisting of red (R), green (G), blue (B), and white (W) subpixels.

That is, all elements (e.g., transistors or a capacitors) of one stage for driving one gate line (scan line) are disposed in a plurality of unit pixel regions driven by a corresponding gate line (scan line).

Also, two or more stages for driving one gate line (scan line) may be distributed and arranged in a plurality of unit pixel regions driven by the corresponding gate line (scan line).

If one stage is disposed, it is desirable that elements (e.g., TFTs or capacitors) constituting one stage be distributively disposed in a middle part of the plurality of unit pixel regions driven by a corresponding gate line (scan line).

If two stages for driving one gate line (scan line) are disposed, it is desirable that elements (e.g., TFTs or capacitors) constituting the two stages be distributively disposed in both edge parts of a plurality of unit pixel regions driven by a corresponding gate line (scan line).

While, in FIGS. 29 and 30, the GIP circuit unit 31 is disposed in every unit pixel region, the present disclosure is not limited thereto and the GIP circuit unit 31 may not be disposed in partial unit pixel regions.

The GIP internal connection wiring unit 32 is a region in which connection wirings (e.g., a Qnode, a Qb node, etc.) for connecting elements of the stage illustrated in FIG. 6 are disposed.

The pixel circuit unit 33 includes at least three subpixel units R, G, B, and W.

The pixel circuit unit 33, the GIP circuit unit 31, and the GIP internal connection wiring unit 32 may be variously disposed.

FIGS. 31A to 31D are diagrams illustrating arrangement locations of a GIP circuit unit according to the third embodiment of the present disclosure.

Figure 31A:
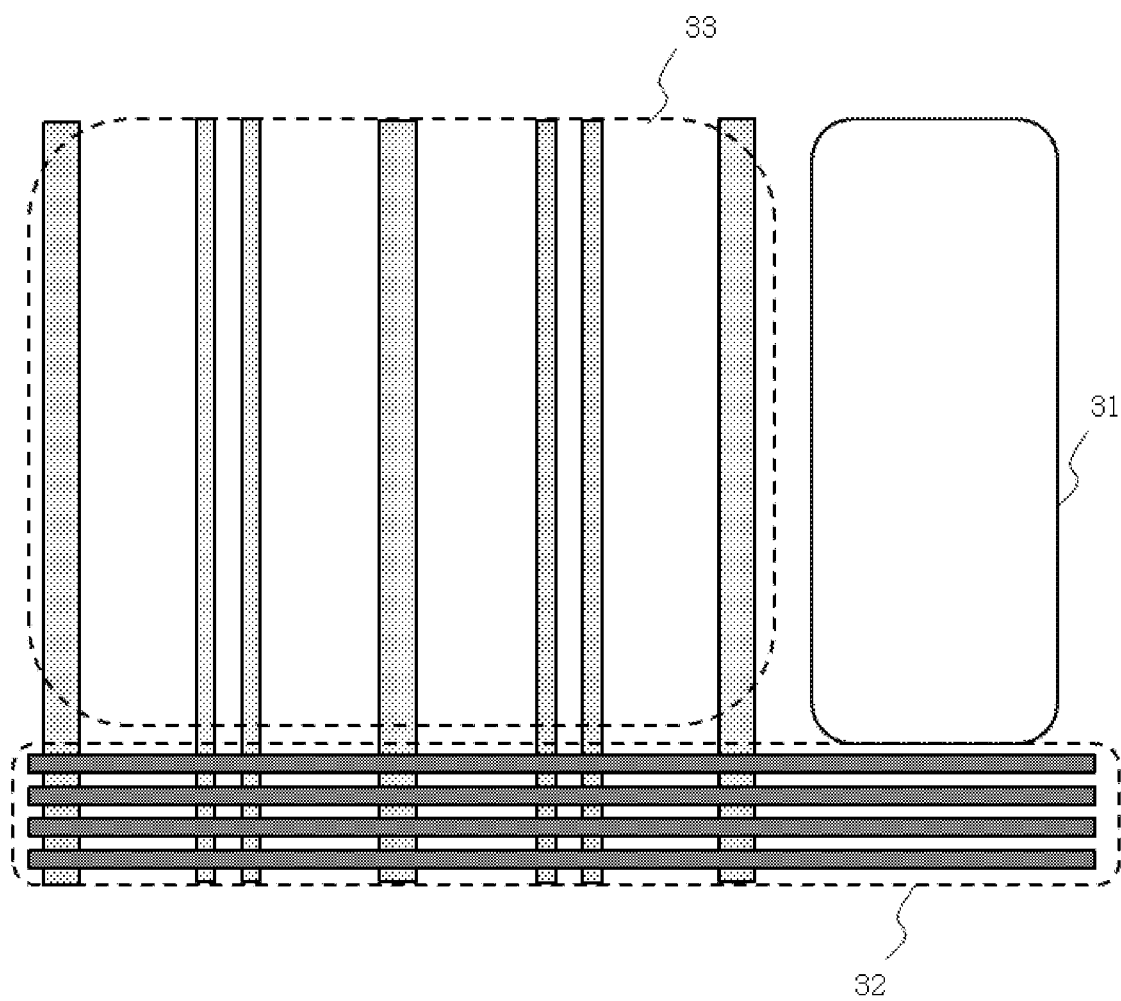
FIGS. 31A to 31D are diagrams illustrating arrangement locations of a GIP unit according to the third embodiment of the present disclosure.

As illustrated in FIG. 31A, the GIP circuit unit 31 may be disposed at the upper side of the GIP internal connection wiring unit 32 and on the right side of the pixel circuit unit 33.

Figure 31B:
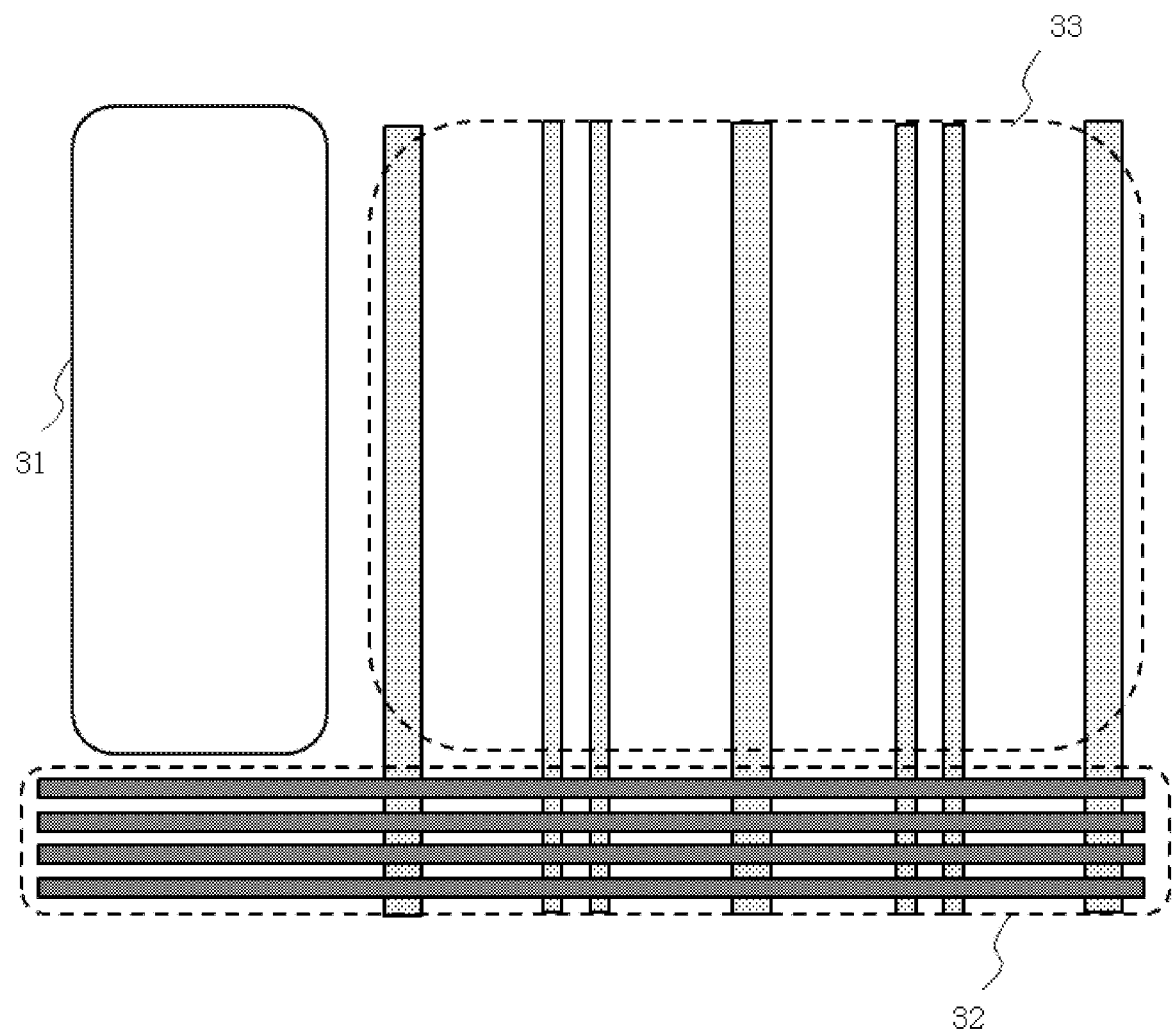

As illustrated in FIG. 31B, the GIP circuit unit 31 may be disposed at the upper side of the GIP internal connection wiring unit 32 and on the left side of the pixel circuit unit 33.

Figure 31C:
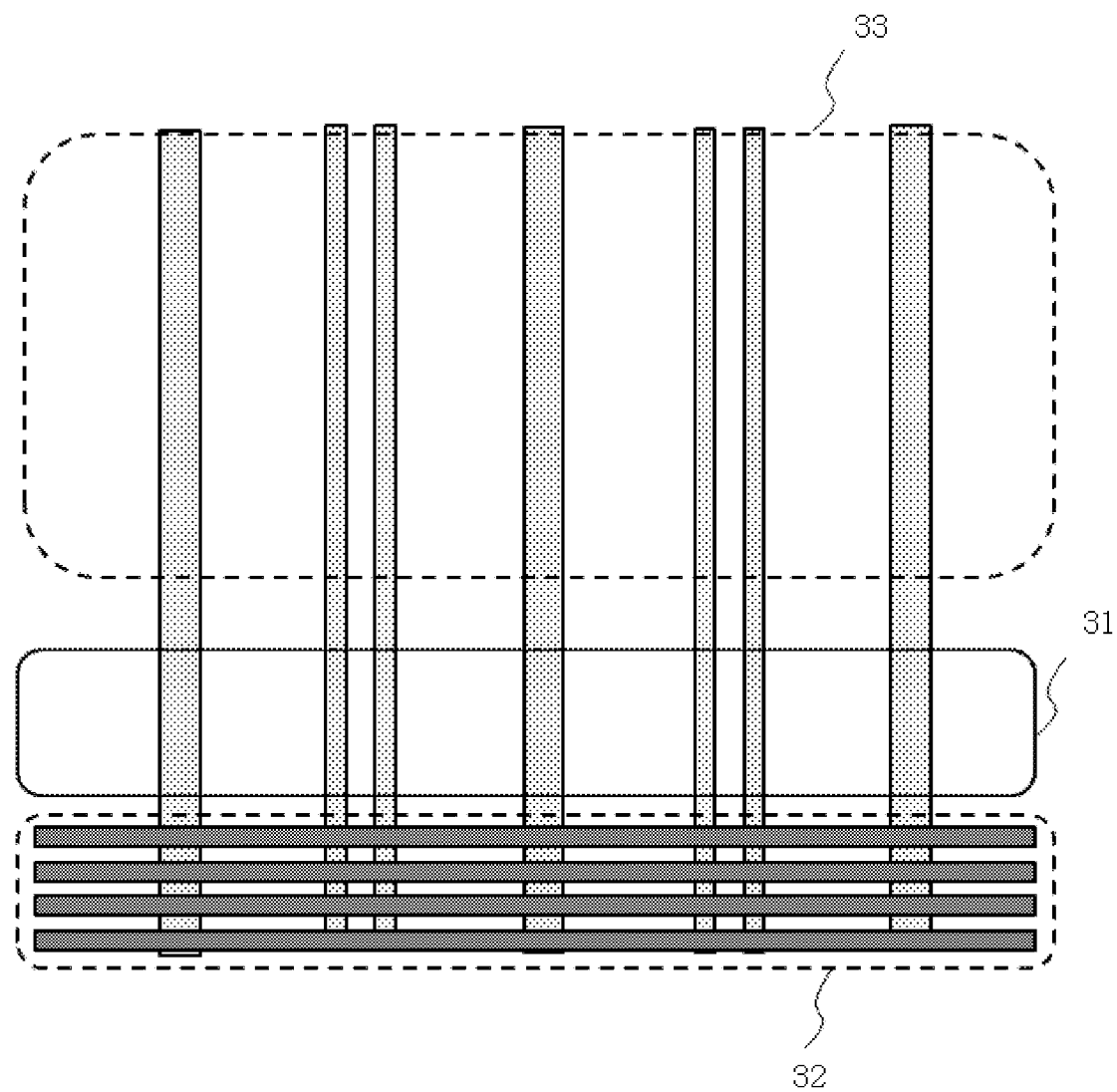

As illustrated in FIG. 31C, the GIP circuit unit 31 may be disposed between the GIP internal connection wiring unit 32 and the pixel circuit unit 33.

Figure 31D:
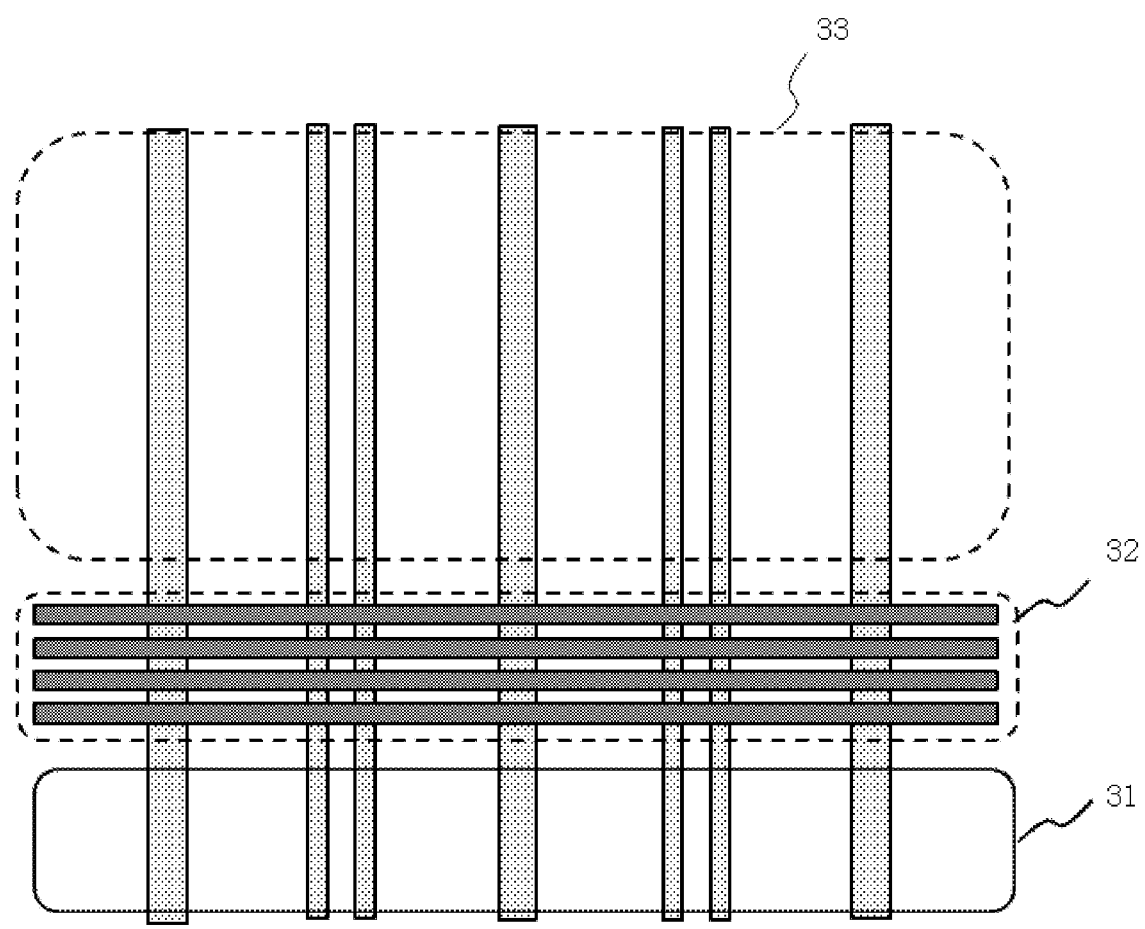

As illustrated in FIG. 31D, the GIP circuit unit 31 may be disposed at the lower side of the GIP internal connection wiring unit 32, which is an opposite side of the pixel circuit unit 33.

Meanwhile, when elements of the stage are disposed in a display region, functional arrangement of the elements can simplify wirings of the GIP internal connection wiring unit 32.

Figure 32:
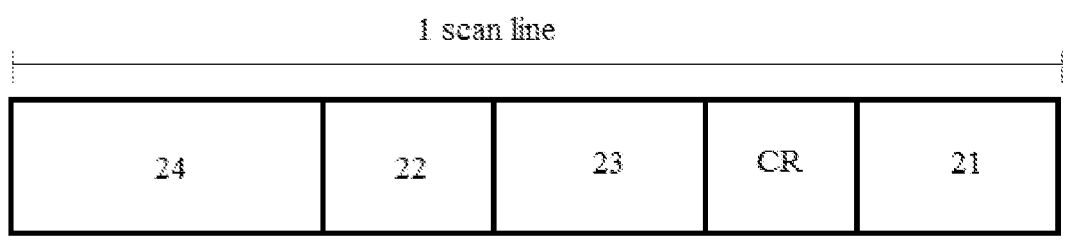
FIG. 32 is a diagram illustrating an arrangement state of GIP elements according to the third embodiment of the present disclosure.

FIG. 32 is a diagram illustrating an arrangement state of elements of the stage according to the third embodiment of the present disclosure.

As illustrated in FIG. 6, the stage according to the present disclosure includes the first output circuit unit 24 for outputting a gate pulse SCout(n) through a first output terminal according to a voltage of a Q node and a voltage of a Qb node, the second output circuit unit 23 for outputting a carry signal Ccout(n) through a second output terminal according to the voltage of the Q node and the voltage of the Qb node, and a switch circuit for charging and discharging the Q node and a Qb node.

In this case, the second output circuit unit 23 includes the pull-up transistor T6cr and the pull-down transistor T7cr for outputting a carry signal Cout(n). The first output circuit unit 24 includes the pull-up transistor T6, the pull-down transistor T7, and the bootstrapping capacitor Cq, for outputting a scan pulse SCout(n).

Accordingly, in arranging the elements of the stage in a display region, the first output circuit unit 24 (T6, T7, and Cq) may be arranged first as illustrated in FIG. 32. Next, the inverter unit 22, the blank time first-node and second-node control units 21 and 26, the second output circuit unit 23 (T6cr and T7cr), a carry signal connection line (CR) and the switching circuit unit 21 may be sequentially arranged. Then, wirings of the GIP internal connection wiring unit 32 can be simplified.

Herein, some elements of the switching circuit unit 21 can be disposed between the inverter unit 22 and the second output circuit unit 23, and the remaining elements of the switching circuit unit 21 can be disposed at the end.

In addition, in arranging the elements of the stage in the display region as described above, the transistor T6 constituting the first output circuit unit 24 among the elements of the stage requires a wider width than other transistors.

That is, the transistor T6 constituting the first output circuit unit 24 should minimize a delay upon outputting the clock signal SCCLK for scan pulse output as a scan pulse. Therefore, the width of the transistor T6 constituting the first output circuit unit 24 is wider than widths of other transistors.

For a similar reason, the transistor T1 of the switching circuit unit 21 requires a wider width than other transistors.

Although the width of the transistor T6 constituting the first output circuit unit 24 and the width of the transistor T1 of the switching circuit unit 21 should be designed to be wider than widths of other transistors, the transistor T6 constituting the first output circuit unit 24 cannot be arranged in one unit pixel region because a unit pixel region is limited. Therefore, elements requiring a relatively wide width such as the transistor T6 constituting the first output circuit unit 24 and the transistor T1 of the switching circuit unit 21 may be split to be spread in a horizontal direction, so that large transistors may be arranged in a limited unit pixel region.

Figure 33:
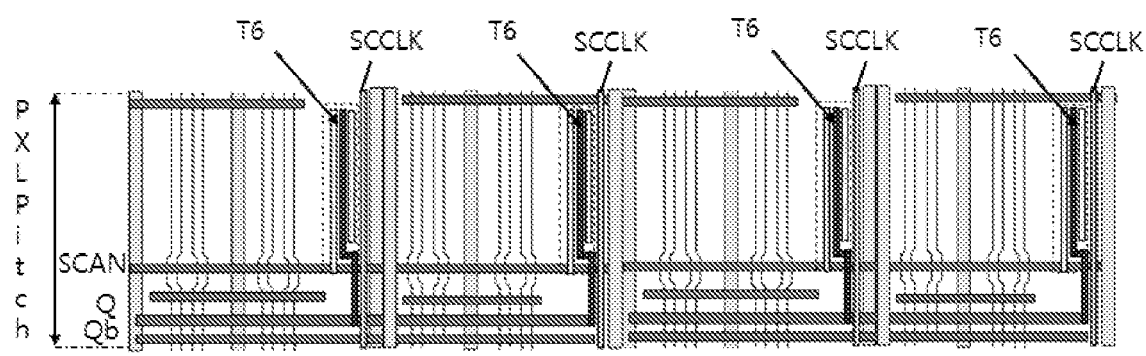
FIG. 33 is a diagram illustrating an arrangement state of a TFT having a large size among GIP elements according to the third embodiment of the present disclosure.

FIG. 33 is a diagram illustrating an arrangement state of a TFT having a large size among stage elements according to the third embodiment of the present disclosure.

In FIG. 33, the transistor T6 constituting the first output circuit unit 24 is split to be spread in a horizontal direction. The transistor T1 of the switching circuit unit 21 may be split to be spread in a horizontal direction in the same manner.

That is, as illustrated in FIG. 33, the transistor T6 constituting the first output circuit unit 24 may be split to be spread in a horizontal direction in 4 unit pixel regions.

In addition to the transistor T6 constituting the first output circuit unit 24 and the transistor T1 of the switching circuit unit 21, other transistors having a large size may be split to be spread in a horizontal direction as described with reference to FIG. 33. In addition, even when a wiring width should be increased in order to reduce drop and rising of signals necessary to drive the stage in the display panel, transistors may be dividedly disposed per unit pixel region.

In this way, since at least one stage is disposed in a plurality of unit pixel regions driven by one gate (scan) line by distributively disposing elements constituting the stage in, left and right bezels of the display panel can be minimized.

FIGS. 29 to 33 show that at least one stage is disposed in one scan line in the display region.

As illustrated in FIG. 3, the data driving circuit includes a plurality of source drive ICs SIC. In FIG. 3, 6 source drive ICs are illustrated.

According to another embodiment, the display region of the display panel is divided into a plurality of blocks, which are regions driven by the respective driving ICs. Further, one or more gate driving circuit may be arranged for each block.

Figure 34:
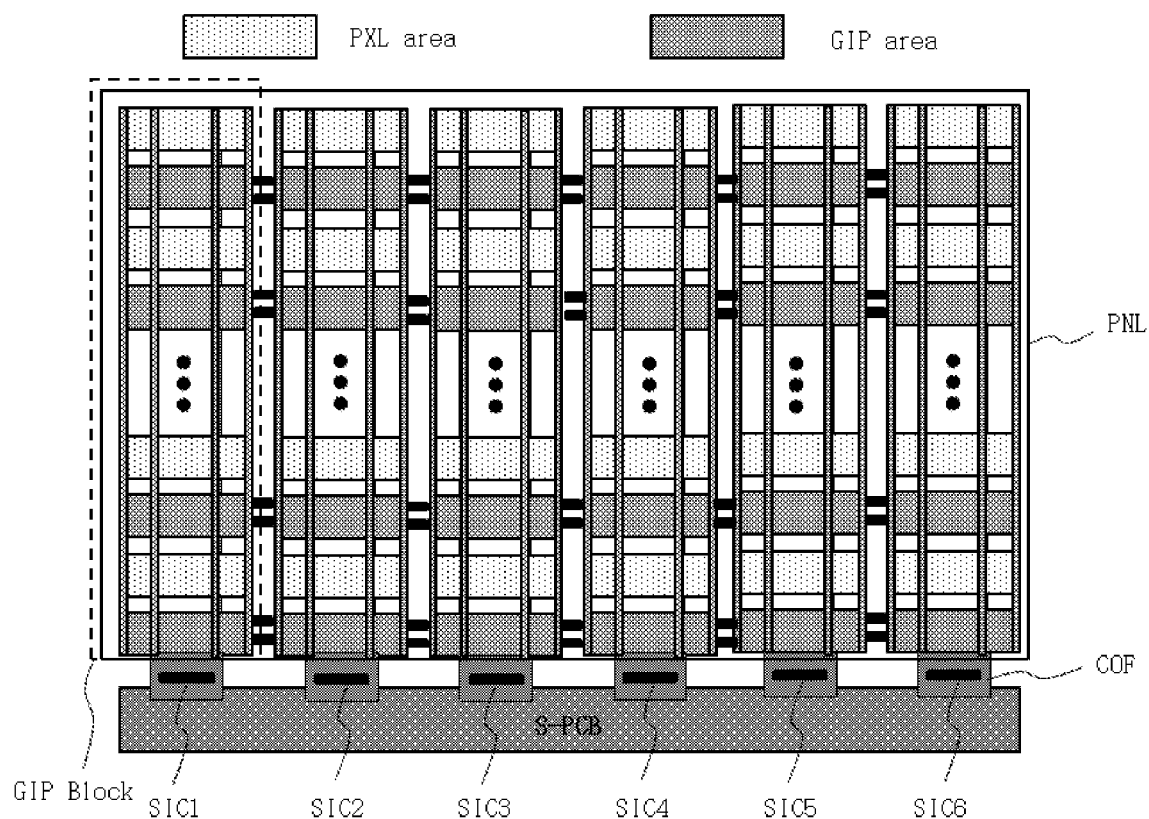
FIG. 34 is a diagram illustrating configuration of a display region of a display panel according to a fourth embodiment of the present disclosure.
Figure 35:
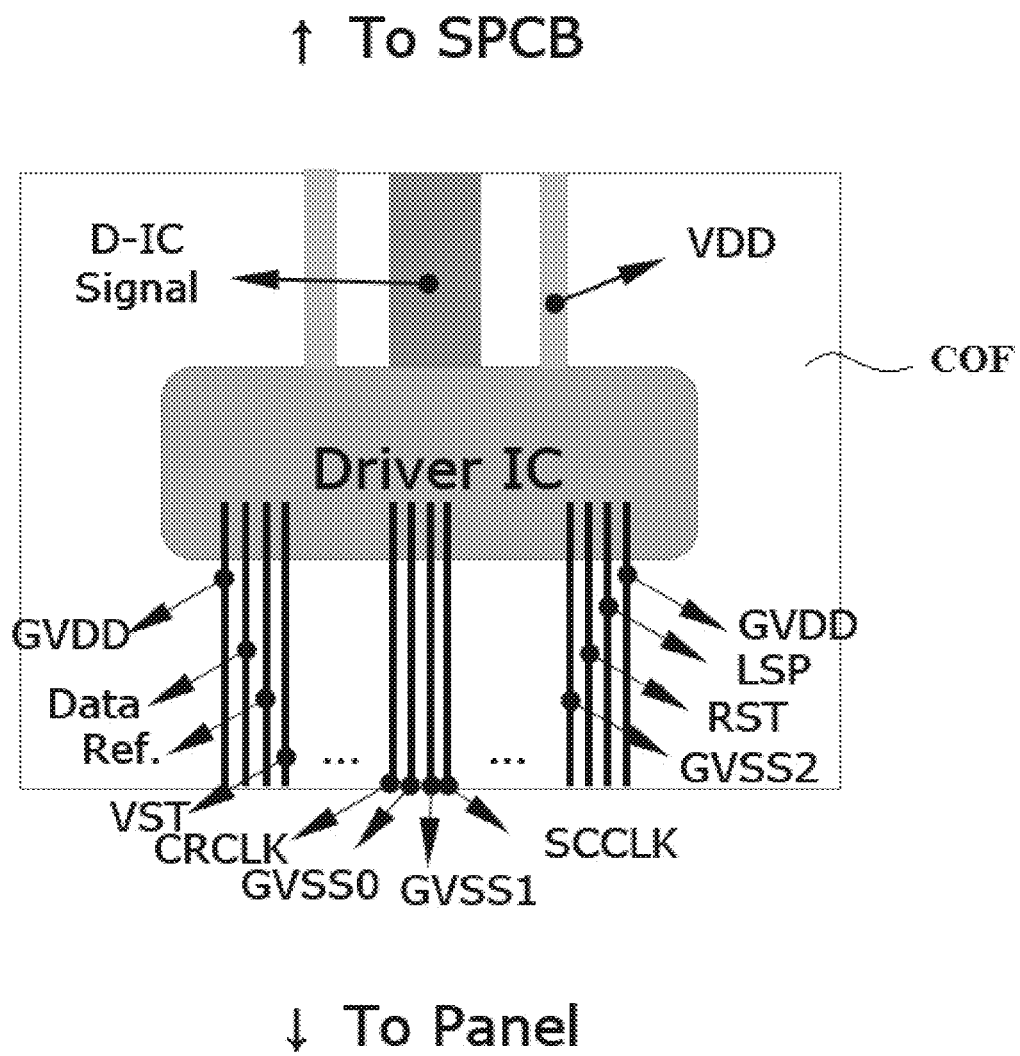
FIG. 35 is a diagram illustrating configuration of a COF and a source drive IC in FIG. 34.

FIG. 34 is a diagram illustrating configuration of a display region of a display panel according to a fourth embodiment of the present disclosure. FIG. 35 is a diagram illustrating configuration of a COF and a source drive IC in FIG. 34.

Referring to FIG. 34, an OLED display device according to the fourth embodiment of the present disclosure includes a display panel PNL and a data driving circuit for providing image data to the display panel PNL.

As shown in FIG. 3, a display region AA of the display panel PNL includes a plurality of data lines data lines DL1 to DLm and a plurality of gate lines GL1 to GLn which cross each other and a plurality of subpixels arranged in a matrix form by the data lines DL1 to DLm and the gate lines GL1 to GLn. The display region AA of the display panel PNL may further include touch sensors.

The plural subpixels include red (R), green (G), and blue (B) subpixels to implement colors and may further include a white (W) pixel in addition to the red (R), green (G), and blue (B) subpixels.

The red (R), green (G), and blue (B) subpixels may constitute one unit pixel or the red (R), green (G), blue (B), and white (W) subpixels may constitute one unit pixel.

Elements (e.g., TFTs, capacitors, etc.) constituting a stage of the gate driving circuit are distributively arranged in the unit pixel regions.

A detailed description of the above configuration will now be given.

The driving circuit includes a data driving circuit for supplying an image data voltage to the data lines DL1 to DLm of the display panel PNL, a gate driving circuit for supplying a scan pulse synchronized with the image data voltage to the gate lines GL1 to GLn of the display panel PNL, and a timing controller (refer to the timing controller 20 in FIG. 3) for controlling operation timings of the data driving circuit and the gate driving circuit.

The data driving circuit includes a plurality of source drive ICs SIC1 to SIC6. In FIG. 34, the data driving circuit includes 6 source drive ICs SIC1 to SIC6.

The 6 source drive ICs SIC1 to SIC6 are embedded in 6 COFs. As shown in FIG. 35, each COF is bonded to a pad region of the display panel PNL and a source PCB SPCB through an ACF. Input pins of the COFs are electrically connected to output terminals of the source PCB SPCB. Output pins of the COFs are electrically connected to pads formed on the pad region of the display panel PNL through the ACF.

The gate driving circuit includes a plurality of stages for receiving a start pulse VST, clock signals CRCLK and SCCLK, a gate high voltage VGH, a gate low voltage VGL, etc. from the timing controller and sequentially outputting a scan pulse to the gate lines GL1 to GLn.

The plurality of stages sequentially supply the scan pulse synchronized with the data voltage to the gate lines GL1 to GLn under control of the timing controller to select pixels of one line to which the image data voltage is applied.

Herein, the display region of the display panel is divided into a plurality of blocks, which are regions driven by the respective drive ICs. Further, one or more gate driving circuit may be independently arranged for each block.

Elements (e.g., TFTs, capacitors, etc.) constituting at least one stage are distributively disposed in a plurality of unit pixel regions driven by each gate line for each block.

In more detail, at least one gate driving circuit is disposed in each block driven by each of the source drive ICs SIC1, SIC2, SIC3, SIC4, SIC5, and SIC6. In this case, elements (e.g., TFTs, capacitors, etc.) constituting at least one stage are distributively disposed in a plurality of unit pixel regions driven by each of a plurality of gate lines (scan lines) of each block.

For example, if a display panel is a model of UHD (3840*2160), at least 2160 stages are disposed in each block driven by each of the source drive ICs SIC1, SIC2, SIC3, SIC4, SIC5, and SIC6.

As mentioned above, stages are dividedly disposed in each display area driven by each of the source drive ICs SIC1 to SIC6, and two or more stages may be disposed in a plurality of unit pixel regions arranged in each gate line (scan line).

Accordingly, such a configuration in which stages are dividedly disposed in each block driven by each of the source drive ICs SIC1 to SIC6, a unit pixel region of the display region may be implemented as the pixel circuit unit 33 including at least three subpixel units R, B, G, and W, the GIP circuit unit 31, and GIP internal connection wiring unit 32, as described with reference to FIGS. 29 and 30.

In addition, gate driving circuits are dividedly disposed in each block driven by each of the source drive ICs SIC1 to SIC6, and the pixel circuit 33 including at least three subpixel units R, B, G, and W, the GIP circuit unit 31, and GIP internal connection wiring unit 32 may be variously arranged as described with reference to FIGS. 31A to 31D.

If gate driving circuits are dividedly arranged in each block driven by each of the source drive ICs SIC1 to SIC6 and, as described with reference to FIG. 32, the first output circuit unit 24 (T6, T7, and Cq) may be arranged first as illustrated in FIG. 32. Next, the inverter unit 22, the blank time first-node and second-node control units 21 and 26, the second output circuit unit 23 (T6cr and T7cr), a carry signal connection line (CR) and the switching circuit unit 21 may be sequentially arranged. Then, wirings of the GIP internal connection wiring unit 32 can be simplified.

Herein, some elements of the switching circuit unit 21 can be disposed between the inverter unit 22 and the second output circuit unit 23, and the remaining elements of the switching circuit unit 21 can be disposed at the end.

If gate driving circuits are dividedly arranged in each block driven by each of the source drive ICs SIC1 to SIC6 and, as described with reference to FIG. 33, if elements requiring a relatively wide width are divided to be spread in a horizontal direction, a large TFT may be disposed in a limited unit pixel region.

In addition, gate driving circuits are dividedly disposed in each display region driven by each of the source drive ICs SIC1 to SIC6, and stages arranged in the same gate line (scan line) with respect to each of the source drive ICs SIC1 to SIC6 are driven by the same carry clock CRCLK for outputting a carry signal and the same scan clock SCCLK for outputting a scan pulse, thereby simultaneously outputting a carry pulse and a scan pulse.

Although gate driving circuits are dividedly disposed in each display region driven by each of the source drive ICs SIC1 to SIC6, each gate line (scan line) may be electrically independent in each display area driven by each of the source drive ICs SIC1 to SIC6, and each gate line (scan line) may be united into the display area driven by each of the source drive ICs SIC1 to SIC6.

Each of the source drive ICs SIC1 to SIC6 supplies a data voltage and various power voltages, for driving a pixel. Also, each of the source drive ICs SIC1 to SIC6 supplies a carry clock CRCLK for outputting a carry signal, scan clock SCCLK for outputting a scan pulse, power voltages GVDD, GVSS0, GVSS1, and GVSS2, a start signal VST, reset signals RESET and RST, and a line selection signal LSP, for driving the stage, to the GIP circuit units 31. As shown in FIG. 35, image data and source signals for driving the gate driving circuits are supplied from the output terminals of the source PCB SPCB to the input pins of the COF, and the COF and the source drive IC supply the carry clock CRCLK, the scan clock SCCLK, the power voltages GVDD, GVSS0, GVSS1, and GVSS2, the start signal VST, the reset signals RESET and RST, and the line selection signal LSP to the pads of the display panel PNL.

Although, in FIG. 34, at least one GIP block is disposed in a display region driven by one source drive IC SIC1, SIC2, SIC3, SIC4, SIC5, or SIC6, the present disclosure is not limited thereto. That is, one GIP block may be arranged in a display area driven by two adjacent source drive ICs SIC1 and SIC2, SIC3 and SIC4, or SIC5 and SIC6 or by three adjacent source drive ICs SIC1 to SIC3, or SIC4 to SIC6.

As is apparent from the above description, a display panel and an OLED display device using the same according to the present disclosure have the following effects.

First, a bezel can be minimized by distributively arranging a gate driving circuit in a display region of a display panel and the gate driving circuit can be disposed in the display panel regardless of the shape of the bezel. Further, the bezel can be minimized without reduction in an aperture ratio and a light-emitting region by disposing a light-emitting region even on the GIP circuit in each subpixel of a top emission structure.

Second, in arranging stages in a display region, if one stage is arranged in a plurality of unit pixel regions driven by one gate line (scan line), the stage may be arranged in a middle part of the plurality of unit pixel regions, or two or more stages may be arranged in the plurality of unit pixel regions driven by one gate line (scan line), so that uniformity of picture quality is efficiently obtained.

Third, since elements of the stage are separately disposed according to function, a GIP internal wiring connection unit can be simplified.

Fourth, since elements having a larger size among elements of the stage are dividedly arranged to be spread, the elements constituting the stage can be sufficiently distributed in a display region.

Fifth, since a pixel circuit unit including at least three subpixel units and a GIP circuit unit are separately disposed in a unit pixel region in a display region, a signal interference phenomenon between a pixel and a GIP can be minimized.

Sixth, since the display region is divided by a group driven by each source drive IC, and elements constituting the stage are distributively disposed in unit pixel regions driven by each gate line in each display region group, signals for driving the GIP can be supplied through each source drive IC.

Although the embodiments of the present disclosure have been disclosed for illustrative purposes, those skilled in the art will appreciate that various modifications, additions and substitutions are possible, without departing from the scope and spirit of the disclosure as disclosed in the accompanying claims.

What is claimed is:

1. An Organic Light-Emitting Diode (OLED) display device, comprising:
    a display panel configured to display an image on a display region of the display panel, and the display panel including a plurality of data lines, a plurality of gate lines crossing the data lines, and unit pixel regions arranged in a matrix at a crossing portion of the data lines and the gate lines;
    a plurality of source drive Integrated Circuits (ICs) configured to supply a data voltage to the data lines;
    a plurality of gate driving circuits arranged distributively in the display region and each of the plurality of gate driving circuits configured to supply a gate pulse to a corresponding one of the plurality of gate lines, and
    a plurality of light-emitting elements arranged distributively in the display region, and each light-emitting element including a first electrode, a second electrode, and a light-emitting layer disposed between the first electrode and the second electrode,
    wherein the display region is divided into a plurality of blocks, which are regions driven by respective ones of the source drive ICs, and each of the plurality of blocks is driven by a corresponding one of the plurality of source drive ICs,
    wherein the light-emitting layers of the plurality of light-emitting elements overlap with the plurality of gate driving circuits, and
    wherein each of the source drive ICs supplies the data voltage and various power voltages for driving pixel circuit units, and supplies a carry clock for outputting a carry pulse, a scan clock for outputting a scan pulse, a start signal, a reset signal, and a line selection signal, for driving each of a plurality of GIP circuit units.

2. The OLED display device according to claim 1, wherein each gate driving circuit includes a plurality of stages, and a stage is arranged distributively in a plurality of unit pixel regions driven by one gate line in each block.

3. The OLED display device according to claim 1, wherein two or more stages are distributively arranged in the plurality of unit pixel regions driven by one gate line.

4. The OLED display device according to claim 1, wherein each of the unit pixel regions includes a pixel circuit unit including at least three subpixel units, a GIP circuit unit in which one element constituting a stage is disposed, and a GIP internal connection wiring unit in which connection wirings for connecting elements of the stage are disposed.

5. The OLED display device according to claim 4, wherein the GIP circuit unit is disposed at an upper side of the internal connection wiring unit and on a right side of the pixel circuit unit.

6. The OLED display device according to claim 4, wherein the GIP circuit unit is disposed at an upper side of the internal connection wiring unit and on a left side of the pixel circuit unit.

7. The OLED display device according to claim 4, wherein the GIP circuit unit is disposed between the GIP internal connection wiring unit and the pixel circuit unit.

8. The OLED display device according to claim 7, wherein elements constituting each of the stages are arranged in order of a first output circuit, an inverter unit, second output circuit, and a switching circuit unit.

9. The OLED display device according to claim 4, wherein the GIP circuit unit is disposed at a lower side of the GIP internal connection wiring unit, which is an opposite side of the pixel circuit unit.

10. The OLED display device according to claim 1, wherein elements constituting each of the stages are distributively disposed in the plurality of unit pixel regions driven by each gate line, and the elements constituting each of the stages are divided according to function.

11. The OLED display device according to claim 1, wherein an element having a relatively large size among elements constituting each of a plurality of stages is divided to be spread in the plurality of unit pixel regions along a corresponding gate line.

12. The OLED display device according to claim 1, wherein the gate lines are electrically independent in each block driven by each of source drive ICs.

13. The OLED display device according to claim 1, wherein the gate lines are unitedly formed in the display region driven by each of the source drive ICs.

14. The OLED display device according to claim 1,
wherein one of the plurality of gate driving circuits is arranged in two adjacent blocks driven by two adjacent source drive ICs.

15. The organic light-emitting diode (OLED) display device according to claim 14, wherein each of the unit pixel regions includes a pixel circuit unit including at least three subpixel units, and
wherein at least one of the plurality of the light-emitting elements overlaps with one of the three subpixel units of the pixel circuit.

16. The organic light-emitting diode(OLED) display device according to claim 1,
wherein each of the unit pixel regions includes a pixel circuit unit including at least three subpixel units, and
wherein at least one of the plurality of the light-emitting elements overlaps with one of the three subpixel units of the pixel circuit.

* * * * *